US009439276B2

(12) United States Patent
Yabu et al.

(10) Patent No.: US 9,439,276 B2
(45) Date of Patent: Sep. 6, 2016

(54) EXTREME ULTRAVIOLET LIGHT GENERATING SYSTEM

(71) Applicant: GIGAPHOTON INC., Tochigi (JP)

(72) Inventors: Takayuki Yabu, Tochigi (JP); Takashi Saito, Tochigi (JP); Osamu Wakabayashi, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 14/937,332

(22) Filed: Nov. 10, 2015

(65) Prior Publication Data

US 2016/0066401 A1 Mar. 3, 2016

Related U.S. Application Data

(63) Continuation of application No. PCT/JP2014/065638, filed on Jun. 12, 2014.

(30) Foreign Application Priority Data

Jun. 20, 2013 (JP) ................................ 2013-129633

(51) Int. Cl.
 *H05G 2/00* (2006.01)
 *G03F 7/20* (2006.01)

(52) U.S. Cl.
 CPC ............ *H05G 2/008* (2013.01); *G03F 7/2006* (2013.01); *G03F 7/70033* (2013.01); *H05G 2/006* (2013.01)

(58) Field of Classification Search
 CPC ........ H05G 2/00; H05G 2/001; H05G 2/003; H05G 2/005; H05G 2/006; H05G 2/008; G03F 7/70025; G03F 7/70033; G21K 5/00; G21K 5/02; G21K 5/04; G21K 5/06; G21K 5/08; G21K 5/10
 See application file for complete search history.

(56) References Cited

U.S. PATENT DOCUMENTS

| 7,068,367 | B2 | 6/2006 | Stobrawa et al. | |
| 7,589,337 | B2* | 9/2009 | Bykanov | H05G 2/001 250/495.1 |
| 2007/0170377 | A1* | 7/2007 | Nakano | H05G 2/005 250/504 R |
| 2010/0294958 | A1* | 11/2010 | Hayashi | H05G 2/006 250/504 R |
| 2011/0220816 | A1* | 9/2011 | Kakizaki | H05G 2/003 250/504 R |
| 2012/0080584 | A1* | 4/2012 | Partlo | G03F 7/70033 250/214.1 |
| 2012/0092746 | A1* | 4/2012 | Hou | H01S 3/076 359/285 |
| 2013/0032735 | A1* | 2/2013 | Nowak | H01S 3/0085 250/504 R |
| 2013/0051412 | A1 | 2/2013 | Miyao et al. | |
| 2013/0099140 | A1* | 4/2013 | Nakarai | H01S 3/0057 250/493.1 |

FOREIGN PATENT DOCUMENTS

| JP | 2012-191171 A | 10/2012 |
| JP | 2013-065804 A | 4/2013 |

OTHER PUBLICATIONS

International Search Report, PCT/JP2014/065638, Sep. 16, 2014.

* cited by examiner

*Primary Examiner* — David E Smith
(74) *Attorney, Agent, or Firm* — Studebaker & Brackett PC

(57) ABSTRACT

There is provided an extreme ultraviolet light generating system. The extreme ultraviolet light generating system may include: a laser apparatus configured to provide pulsed laser light inside a chamber in which EUV light is generated; an optical shutter disposed on an optical path of the pulsed laser light; and a controller configured to open or close the optical shutter, based on a generation signal supplied from an external unit, the generation signal instructing generation of the EUV light.

16 Claims, 15 Drawing Sheets

EXTREME ULTRAVIOLET LIGHT GENERATING SYSTEM

CROSS REFERENCE TO RELATED APPLICATIONS

This is a continuation of International Application No. PCT/JP2014/065638, filed Jun. 12, 2014, which claims the benefit of Japanese Priority Patent Application JP2013-129633, filed Jun. 20, 2013, the entire contents of both of which are incorporated herein by reference.

BACKGROUND

The present disclosure relates to an extreme ultraviolet light generating system to generate extreme ultraviolet (EUV) light.

In recent years, miniaturization of a transcription pattern of an optical lithography in a semiconductor process is drastically progressing with the development in fining of the semiconductor process. In the next generation, microfabrication on the order of 70 nm to 45 nm, and further microfabrication on the order of 32 nm or less are bound to be required. To meet such requirement for the microfabrication on the order of, for example, 32 nm or less, development is anticipated of an exposure apparatus that includes a combination of a reduced projection reflective optics and an extreme ultraviolet light generating apparatus that generates extreme ultraviolet (EUV) light with a wavelength of about 13 nm. For example, reference is made U.S. Pat. Nos. 7,068,367 and 7,589,337, and U.S. Patent Application Publication No. 2012/0080584.

As the EUV light generating apparatus, three kinds of apparatuses, laser produced plasma (LPP) apparatus using plasma generated by application of a laser beam to a target substance, a discharge produced plasma (DPP) apparatus using plasma generated by discharge, and a synchrotron radiation (SR) apparatus using orbital radiation light have been proposed.

SUMMARY

An extreme ultraviolet light generating system according to an embodiment of the disclosure may include: a laser apparatus configured to provide pulsed laser light inside a chamber in which EUV light is generated; an optical shutter disposed on an optical path of the pulsed laser light; and a controller configured to open or close the optical shutter, based on a generation signal supplied from an external unit, the generation signal instructing generation of the EUV light.

BRIEF DESCRIPTION OF THE DRAWINGS

Some example embodiments of the disclosure are described below as mere examples with reference to the accompanying drawings.

DETAILED DESCRIPTION

Figure 1:
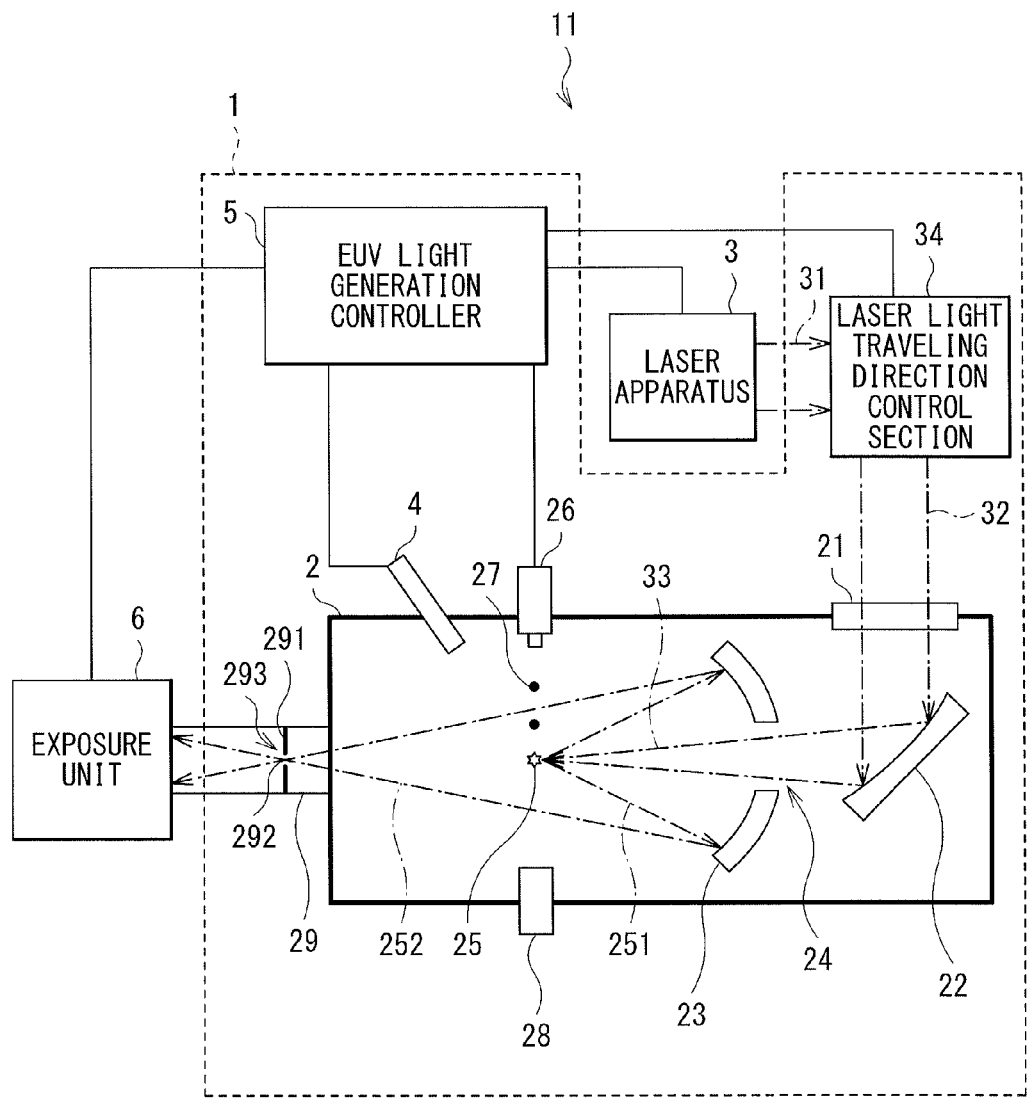
FIG. 1 schematically illustrates a configuration example of an exemplary LPP EUV light generating system.

[Contents]
[1. Outline]
[2. General Description of EUV Light Generating System]
  2.1 Configuration
  2.2 Operation
[3. EUV Light Generating System Generating EUV Light Based on Burst Signal]
  3.1 Configuration
    3.1.1 Entire Configuration
    3.1.2 Configuration of Light Emission Control System Section
  3.2 Operation
    3.2.1 Overall Operation
    3.2.2 Operation of Light Emission Control System Section
  3.3 Issues
[4. Light Emission Control System Section Including Control of Optical Shutter] (First Embodiment)
  4.1 Configuration
  4.2 Operation
  4.3 Action
  4.4 Modifications
[5. Light Emission Control System Section Including Timing Signal Generating Circuit] (Second Embodiment)
  5.1 Configuration
  5.2 Operation
  5.3 Action
  5.4 Modifications

[6. Light Emission Control System Section Including Control of Optical Isolator] (Third Embodiment)
   6.1 Configuration
   6.2 Operation
   6.3 Action
   6.4 Modifications

[7. Light Emission Control System Section Including Control of Pre-Pulsed Laser Unit] (Fourth Embodiment)
   7.1 Configuration
   7.2 Operation
   7.3 Action

[8. Light Emission Control System Section Including Control of Target in On-Demand Target Feeding Section] (Fifth Embodiment)
   8.1 Configuration
   8.2 Operation
   8.3 Action

[9. Others]
   9.1 Configuration Example of Optical Shutter
   9.2 Configuration Example of Optical Isolator
   9.3 Hardware Environment of Control Section Hereinafter, some embodiments of the disclosure are described in detail with reference to the drawings. The embodiments described below each illustrate one example of the disclosure and are not intended to limit the contents of the disclosure. Also, all of the configurations and operation described in each embodiment are not necessarily essential for the configurations and operation of the disclosure. Note that the like components are denoted with the same reference numerals, and any redundant description thereof is omitted.

1. Outline

The disclosure relates to a control apparatus generating a burst pulse of EUV light.

2. General Description of EUV Light Generating System

2.1 Configuration

FIG. 1 schematically illustrates a configuration of an exemplary LPP EUV light generating system. An EUV light generating system 1 may be used together with one or more laser apparatuses 3. In the embodiment of the present application, a system including the EUV light generating apparatus 1 and the laser apparatus 3 is referred to as an EUV light generating system 11. As illustrated in FIG. 1 and as described in detail below, the EUV light generating apparatus 1 may include a chamber 2 and, for example, a target feeder 26 serving as a target feeder. The chamber 2 may be sealable. The target feeder 26 may be so attached as to penetrate a wall of the chamber 2, for example. A material of a target substance to be fed from the target feeder 26 may be tin, terbium, gadolinium, lithium, xenon, or any combination of two or more thereof without limitation.

One or more through holes may be provided on the wall of the chamber 2. The through hole may be provided with a window 21. Pulsed laser light 32 outputted from the laser apparatus 3 may pass through the window 21. For example, an EUV light concentrating mirror 23 having a spheroidal reflection surface may be disposed inside the chamber 2. The EUV light concentrating mirror 23 may include a first focal point and a second focal point. A multilayer reflection film in which, for example, molybdenum and silicon are alternately stacked may be provided on a surface of the EUV light concentrating mirror 23. The EUV light concentrating mirror 23 may be preferably disposed in such a manner that, for example, the first focal point is located in a plasma generation region 25 or in the vicinity of the plasma generation region 25 and the second focal point is located at an intermediate focus point (IF) 292 that is a desired light concentration position defined by specifications of an exposure unit 6. A through hole 24 may be provided at a center part of the EUV light concentrating mirror 23, and pulsed laser light 33 may pass through the through hole 24.

The EUV light generating apparatus 1 may include an EUV light generation controller 5. The EUV light generation controller 5 may include a target sensor 4, etc. The target sensor 4 may detect one or more of presence, trajectory, position, and speed of a target 27. The target sensor 4 may include an image pickup function.

The EUV light generating apparatus 1 may further include a connection section 29 that allows the inside of the chamber 2 to be in communication with the inside of the exposure unit 6. A wall 291 provided with an aperture 293 may be provided inside the connection section 29. The wall 291 may be disposed so that the aperture 293 is located at the second focal point of the EUV light concentrating mirror 23.

The EUV light generating apparatus 1 may include a laser light traveling direction control section 34, a laser light concentrating mirror 22, a target collector 28, etc. The target collector 28 may collect the target 27. The laser light traveling direction control section 34 may include, in order to control the traveling direction of the laser light, an optical device that defines a traveling direction of the laser light and an actuator that adjusts position, attitude, etc., of the optical device.

2.2 Operation

Referring to FIG. 1, the pulsed laser light 31 outputted from the laser apparatus 3 may travel through the laser light traveling direction control section 34, and the pulsed laser light 31 that has passed through the laser light traveling direction control section 34 may enter, as the pulsed laser light 32, the chamber 2 after passing through the window 21. The pulsed laser light 32 may travel inside the chamber 2 along one or more laser light paths, and then may be reflected by the laser light concentrating mirror 22. The pulsed laser light 32 reflected by the laser light concentrating mirror 22 may be applied, as the pulsed laser light 33, to one or more targets 27.

The target feeder 26 may be adapted to output the target 27 to the plasma generation region 25 inside the chamber 2. The target 27 may be irradiated with one or more pulses included in the pulsed laser light 33. The target 27 irradiated with the pulsed laser light may turn into plasma, and EUV light 251 may be radiated together with radiation light from the plasma. The EUV light 251 may be reflected and concentrated by the EUV light concentrating mirror 23. EUV light 252 reflected by the EUV light concentrating mirror 23 may be outputted to the exposure unit 6 through the intermediate focus point 292. Note that a plurality of pulses included in the pulsed laser light 33 may be applied to one target 27.

The EUV light generation controller 5 may be adapted to manage control of the entire EUV light generating system 11. The EUV light generation controller 5 may be adapted to process, for example, data of an image of the target 27 picked up by the target sensor 4. For example, the EUV light generating controller 5 may be adapted to control one or both of control of output timing of the target 27 and control of an output direction of the target 27.

For example, the EUV light generation controller 5 may be adapted to control one or more of oscillation timing of the laser apparatus 3, the traveling direction of the pulsed laser light 32, and a concentration position of the pulsed laser light 33. The above-described various controls are illustrative, and other control may be added as necessary.

Figure 2:
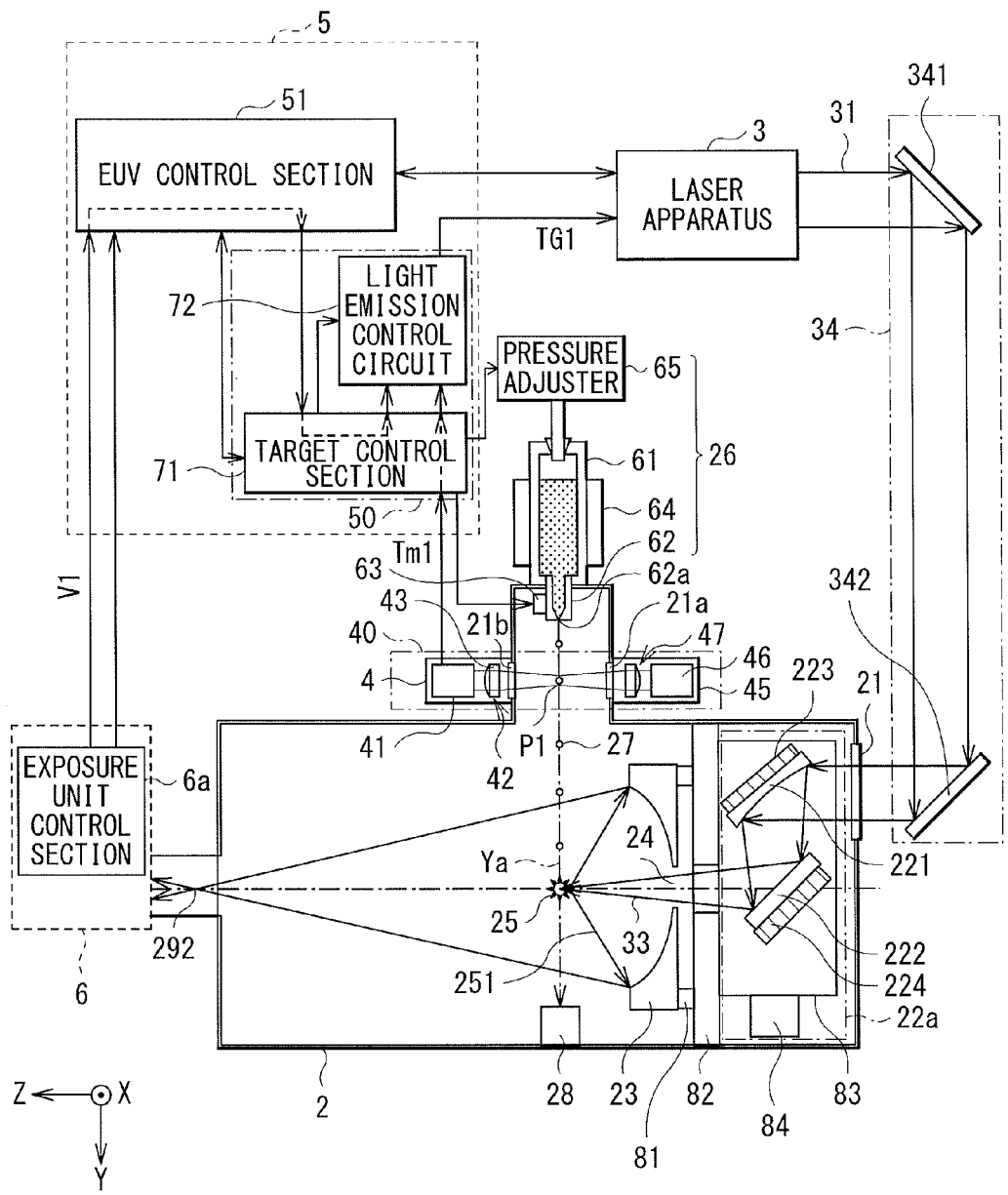
FIG. 2 schematically illustrates a configuration example of an EUV light generating system generating EUV light based on a burst signal.

3. EUV Light Generating System Generating EUV Light Based on Burst Signal 3.1 Configuration
3.1.1 Entire Configuration FIG. 2 illustrates a configuration example of an EUV light generating system generating EUV light based on a burst signal V1. The EUV light generating system may include the chamber 2, the laser apparatus 3, the EUV light generation controller 5, and the laser light traveling direction control section 34. The EUV light generation controller 5 may include a light emission control system section 50 and an EUV control section 51. The light emission control system section 50 may include a target control section 71 and a light emission control circuit 72.

The laser light traveling direction control section 34 may be disposed so that the pulsed laser light 31 outputted from the laser apparatus 3 enter the chamber 2. The laser apparatus 3 may be, for example, a $CO_2$ laser unit that outputs the pulsed laser light 31 with a repetition frequency in a range from 50 kHz to 100 kHz.

The chamber 2 may include a laser concentrating optical system 22a, a plate 82, and an XYZ axis stage 84. The chamber 2 may further include the EUV light concentrating mirror 23, a mirror holder 81, the window 21, and the target collector 28. The window 21 may be fixed to an inside wall of the chamber 2 by sealing. The chamber 2 may be attached with the target feeder 26 and a target detection unit 40.

The laser concentrating optical system 22a may include a plate 83, a holder 223, a holder 224, an off-axis parabolic mirror 221, and a flat mirror 222. The off-axis parabolic mirror 221 may be retained to the plate 83 by the holder 223. The flat mirror 222 may be retained to the plate 83 by the holder 224. A position and an attitude of each of the off-axis parabolic mirror 221 and the flat mirror 222 may be maintained so that the pulsed laser light 33 reflected by the off-axis parabolic mirror 221 and the flat mirror 222 is concentrated at the plasma generation region 25.

The plate 82 may be fixed to a wall inside the chamber 2. The EUV light concentrating mirror 23 may be a mirror having a spheroidal surface around the Z axis. The EUV light concentrating mirror 23 may be fixed to the plate 82 through the mirror holder 81 so that a first focal point of the spheroidal surface is substantially coincident with the plasma generation region 25. A through hole 24 through which the pulsed laser light 33 passes may be provided at a center part of the EUV light concentrating mirror 23.

The laser light traveling direction control section 34 may be configured of two flat mirrors 341 and 342. A reflection surface of each of the flat mirrors 341 and 342, the flat mirror 222, and the off-axis parabolic mirror 221 may be coated with a film that may cause the pulsed laser light 31 to be reflected at high reflectivity. A reflection surface of the EUV light concentrating mirror 23 may be coated with a Mo/Si multilayer film.

The target feeder 26 may include a tank 61, a nozzle 62, a piezo device 63, a heater 64, and a presser adjuster 65. The target feeder 26 may be disposed to allow the target 27 in a droplet form outputted from the nozzle 62 to reach the plasma generation region 25. The target collector 28 may be disposed on an extended line of a trajectory Ya of the droplet target 27. The heater 64 may be provided on the tank 61. The tank 61 may store therein the target 27 that has been molten by the heater 64. The nozzle 62 may include a nozzle hole 62a that outputs the target 27 in the tank 61. The piezo device 63 may be disposed at the nozzle 62. The pressure adjuster 65 may adjust pressure in the tank 61.

The target detection unit 40 may include the target sensor 4 and a light source section 45. The light source section 45 may include a light source 46 and an illumination optical system 47. The light source section 45 may be so disposed as to illuminate the target 27 at a predetermined position P1 that is located on the trajectory Ya between the nozzle 62 of the target feeder 26 and the plasma generation region 25. The illumination optical system 47 may include a light condenser lens and a window 21a. The target sensor 4 may include an optical sensor 41 and a photodetection optical system 42. The target sensor 4 may be so disposed as to receive illumination light outputted from the light source section 45. The photodetection optical system 42 may include a window 21b and a light condenser lens 43.

The target sensor 4 may be disposed on opposite side of the light source section 45 with the trajectory Ya of the target 27 in between. The chamber 2 may be attached with the window 21a and the window 21b. The window 21a may be located between the light source section 45 and the trajectory Ya of the target 27. The light source section 45 may concentrate light on the predetermined position P1 on the trajectory Ya of the target 27 through the window 21a. The window 21b may be located between the trajectory Ya of the target 27 and the target sensor 4. The position of the target 27 detected by the target sensor 4 may be substantially coincident with a light concentrated position by the light source section 45. The target sensor 4 may output, as a detection signal of the target 27, a passage timing signal Tm1. The passage timing signal Tm1 may be a timing signal indicating feed timing of the target 27. The passage timing signal Tm1 outputted from the target sensor 4 may be inputted to the light emission control circuit 72 though the target control section 71.

The EUV light generating system may be demanded to generate the EUV light at a predetermined repetition frequency over a predetermined time period. The predetermined repetition frequency may be in a range from 50 kHz to 100 kHz, for example. To allow the EUV light generating system to generate the EUV light at the predetermined repetition frequency, the target feeder 26 may output the target 27 at the predetermined repetition frequency. The laser apparatus 3 may output the pulsed laser light 31 in response to the feed timing of the target 27. A repetition frequency of the pulsed laser light 31 outputted by the laser apparatus 3 may be equivalent to the predetermined repetition frequency. Output of the pulsed light at the predetermined repetition frequency over the predetermined time period may be referred to as burst in some cases. Further, the pulsed light outputted through burst may be referred to as a burst pulse.

The burst signal V1 as a generation signal that instructs generation of the EUV light through the burst may be supplied to the EUV control section 51 from the exposure unit 6 as an external unit. The exposure unit 6 may include an exposure unit control section 6a. The burst signal V1 may be supplied from the exposure unit control section 6a of the exposure unit 6.

The burst signal V1 outputted from the exposure unit control section 6a may be inputted to the light emission control circuit 72 through the EUV control section 51 and the target control section 71. The light emission control circuit 72 may output, as an output signal, a light emission trigger signal TG1 to the laser apparatus 3.

3.1.2 Configuration of Light Emission Control System Section

Figure 3:
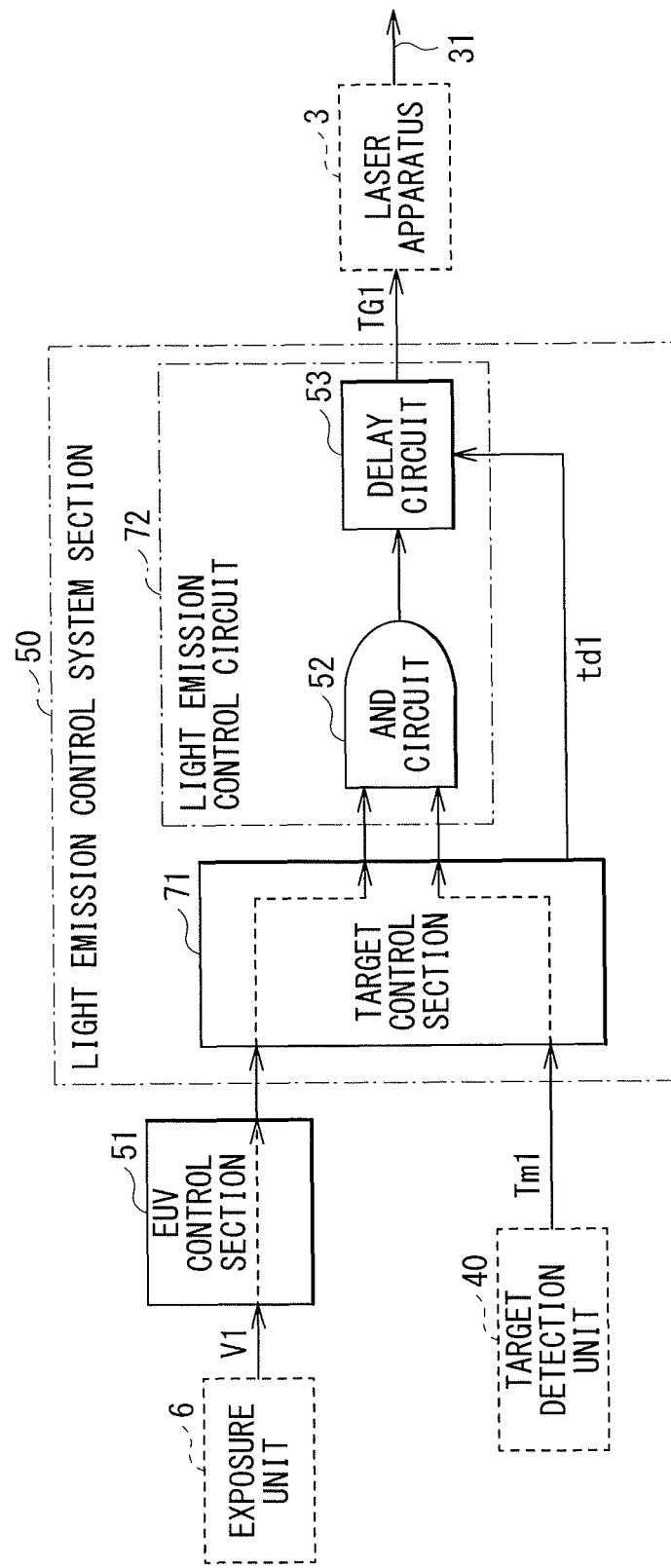
FIG. 3 schematically illustrates a configuration example of a light emission control system section.

FIG. 3 illustrates a configuration example of the light emission control system section 50. In the light emission control system section 50, the light emission control circuit 72 may include an AND circuit 52 and a delay circuit 53. The AND circuit 52 may receive the burst signal V1 outputted from the exposure unit 6 through the EUV control section 51 and the target control section 71. The AND circuit 52 may also receive the passage timing signal Tm1 outputted from the target detection unit 40 through the target control section 71. The AND circuit 52 may output, as an output signal, an AND signal of the burst signal V1 and the passage timing signal Tm1 to the delay circuit 53.

The target control section 71 may output a control signal including setting information of a predetermined delay time td1 to the delay circuit 53. The delay circuit 53 may delay the output signal outputted from the AND circuit 52 by the predetermined delay time td1 to generate the light emission trigger signal TG1, and may output the light emission trigger signal TG1 to the laser apparatus 3. The delay time td1 may be a delay time set to allow the pulsed laser light 31 to be applied to the target 27 at timing when the target 27 detected by the target sensor 4 reaches the plasma generation region 25.

3.2 Operation 3.2.1 Overall Operation

In FIG. 2, when receiving a droplet generation signal from the EUV control section 51, the target control section 71 may perform temperature control in which a material of the target 27 in the tank 61 is heated to a predetermined temperature by the heater 64. For example, when the material of the target 27 is tin (Sn), the target control section 71 may perform the temperature control in which the material is heated to a predetermined temperature, for example, in a range from 250° C. to 290° C. that is equal to or higher than the melting point of 232° C. The target control section 71 may control the pressure adjuster 65 so that the pressure in the tank 61 becomes pressure at which jet to be the target 27 is outputted at a predetermined speed from the nozzle hole 62a of the nozzle 62. The target control section 71 may then supply a voltage having a predetermined waveform to the piezo device 63 so as to generate the droplet target 27. The jet outputted from the nozzle hole 62a may be oscillated by the piezo device 63, and standing wave may occur on a jet surface. As a result, the jet may be divided into the droplet targets 27. The droplet target 27 may be generated in such a way by a continuous jet (CJ) method. For example, the droplet target 27 may be generated at a predetermined frequency in a range from 50 kHz to 100 kHz.

In the target detection unit 40, the target 27 may be illuminated with illumination light from the light source section 45. The target sensor 4 may receive the illumination light outputted from the light source section 45. The target 27 may shield a part of the illumination light when passing through the predetermined position P1 in the chamber 2, which may cause decrease of light intensity to be received by the target sensor 4. The variation of the light intensity may be detected by the optical sensor 41 of the target sensor 4 to make a detection signal of the target 27. The optical sensor 41 may output the detection signal as the passage timing signal Tm1. The target sensor 4 may output one pulse signal as the passage timing signal Tm1 every time detecting one target 27. The passage timing signal Tm1 may be inputted to the light emission control circuit 72 through the target control section 71.

When the burst signal V1 outputted from the exposure unit 6 is inputted to the light emission control circuit 72 through the EUV control section 51 and the target control section 71, the light emission control circuit 72 may generate the light emission trigger signal TG1 that is delayed by the predetermined delay time td1 from the passage timing signal Tm1. The light emission control circuit 72 may then output the light emission trigger signal TG1 to the laser apparatus 3. When the light emission trigger signal TG1 is inputted to the laser apparatus 3, the laser apparatus 3 may output the pulsed laser light 31. The outputted pulsed laser light 31 may enter the window 21 through the laser light traveling direction control section 34. The pulsed laser light 31 that has passed through the window 21 may be concentrated as the pulsed laser light 33 on the plasma generation region 25 by the off-axis parabolic mirror 221 and the flat mirror 222. The droplet target 27 that has reached the plasma generation region 25 may be irradiated with the pulsed laser light 33, thereby turning into plasma to generate the EUV light 251. The EUV light 251 may be concentrated on the intermediate focus point 292 by the EUV concentrating mirror 23, and the concentrated EUV light 251 may be outputted to the exposure unit 6.

When the burst signal V1 outputted from the exposure unit 6 is not inputted to the light emission control circuit 72 through the EUV control section 51 and the target control section 71, the light emission control circuit 72 may not output the light emission trigger signal TG1 to the laser apparatus 3 even if the passage timing signal Tm1 is inputted to the light emission control circuit 72. As a result, the EUV light 251 may not be generated.

The burst pulse of the EUV light 251 may be generated based on the burst signal V1 from the exposure unit 6 in the above-described manner.

3.2.2 Operation of Light Emission Control System Section 50

Figure 4:
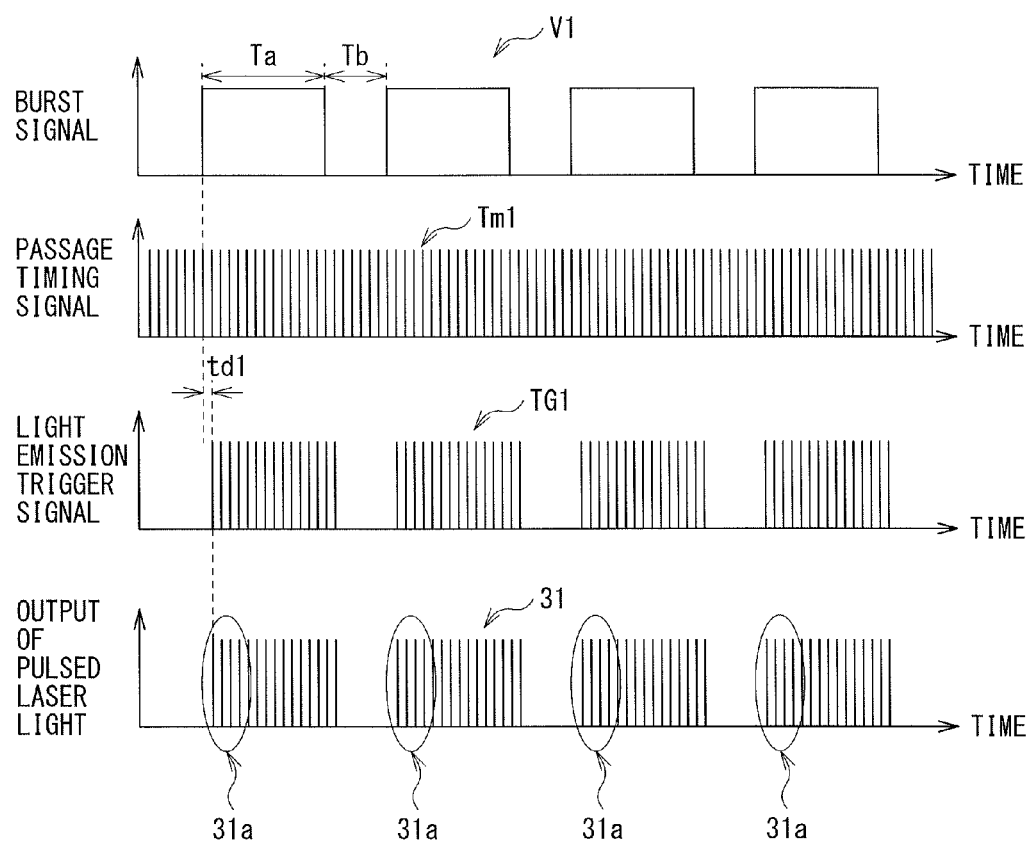
FIG. 4 is a timing chart illustrating an example of timings of light emission control performed by the light emission control system section illustrated in FIG. 3.

FIG. 4 is a timing chart illustrating an example of timings of light emission control by the light emission control system section 50 illustrated in FIG. 3. Note that, in the timing chart in the following description, a vertical axis in the chart indicating signal timing may schematically illustrate a signal level, and a vertical axis in the chart indicating laser light timing may schematically illustrate pulse energy or intensity of the laser light. The burst signal V1 outputted from the exposure unit 6 may be an ON-OFF signal. The ON-OFF signal becomes an ON signal having High signal value during a predetermined period Ta and becomes an OFF signal having Low signal value during a predetermined period Tb as illustrated in FIG. 4. The predetermined period Ta of the ON signal may be a period in which the EUV signal 251 is intended to be generated. The predetermined period Tb of the OFF signal may be a period in which the EUV light 251 may not be generated. The AND circuit 52 may receive such a burst signal V1 outputted from the exposure unit 6 through the EUV control section 51 and the target control section 71.

The AND circuit 52 may receive the passage timing signal Tm1 as illustrated in FIG. 4 from the target detection unit 40 through the target control section 71. The AND circuit 52 may output, as an output signal, an AND signal of the burst signal V1 and the passage timing signal Tm1 to the delay circuit 53. The AND circuit 52 may output a signal that becomes High only when both of the burst signal V1 and the passage timing signal Tm1 become High. The output signal of the AND circuit 52 may be a signal equivalent to the passage timing signal Tm1 outputted during the period in which the burst signal V1 becomes High.

As illustrated in FIG. 4, the delay circuit 53 may delay the output signal from the AND circuit 52 by the predetermined delay time td1 instructed by the target control section 71, to generate the light emission trigger signal TG1. The delay circuit 53 may then output the light emission trigger signal TG1 to the laser apparatus 3. When receiving the light emission trigger signal TG1, the laser apparatus 3 may output the pulsed laser light 31 that is synchronized with the light emission trigger signal TG1, as illustrated in FIG. 4.

The predetermined delay time td1 set to the delay circuit 53 may be difference (Dt1−α) between a time Dt1 and a time α as described below. The time Dt1 may be a time until the target 27 reaches the plasma generation region 25 after the target 27 is detected by the target detection unit 40. The time α may be a time until the pulsed laser light 31 reaches the plasma generation region 25 after the light emission trigger signal TG1 is inputted to the laser apparatus 3.

3.3 Issues

When the light emission control of the pulsed laser light 31 as illustrated in FIG. 3 and FIG. 4 is performed, the pulsed laser light 31 outputted from the laser apparatus 3 may be subjected to the light emission control corresponding to the ON-OFF state of the burst signal V1. In other words, the pulsed laser light 31 may be controlled to a burst emission state in which the pulsed laser light 31 is repeatedly outputted during the predetermined period Ta and a non-emission state in which the pulsed laser light 31 is not outputted during the predetermined period Tb.

The inventors found that, as will be described below, the energy of the pulsed laser light 31 may be unstable at the beginning of the burst starting when the light emission control of the laser apparatus 3 described above is performed.

Figure 5:
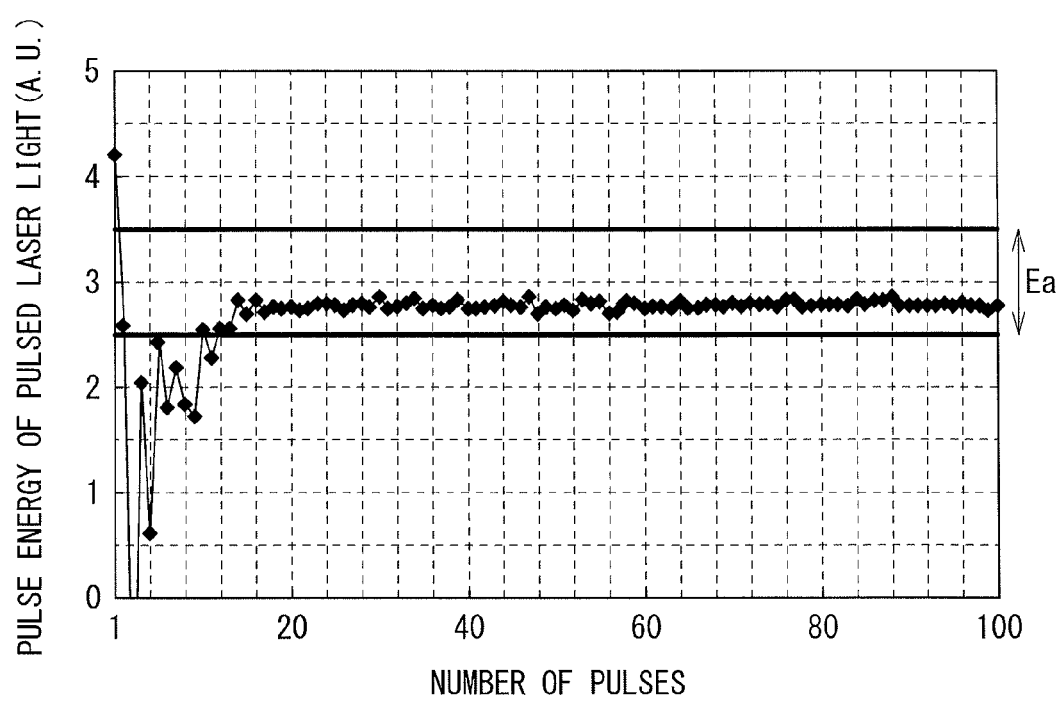
FIG. 5 illustrates an example of pulse energy of pulsed laser light outputted through the light emission control illustrated in FIG. 4.

FIG. 5 illustrates an example of the pulse energy of the pulsed laser light 31 outputted through the light emission control illustrated in FIG. 4. FIG. 5 illustrates the pulse energy of each pulse near the head 31a of the burst as illustrated in FIG. 4, of the pulsed laser light 31 outputted from the laser apparatus 3. For example, the pulses from the head pulse to about 20-th pulse of the burst of the pulsed laser light 31 may include extremely unstable pulse energy. For example, the pulse energy of the pulses subsequent to about 20-th pulse from the head of the pulsed laser light 31 may become stable within a predetermined target range Ea.

When several tens pulses from the head of the burst of the pulsed laser light 31 are applied to the target 27, the following may occur. The several tens pulses from the head of the burst of the pulsed laser light 31 are not applied to the target 27 with the desired pulse energy. Accordingly, first, the energy of the EUV light 251 to be generated may become unstable. Second, an ionization rate of the target substance may decrease and formation of particles not ionized may increase. The ionization rate may be represented by (ion quantity/debris quantity)×100. The particles not ionized may be electrically neutral debris, for example, steam, cluster, and minute droplet.

The concentrating direction of the pulsed laser light 31 outputted from the laser apparatus 3 may be unstable over several tens pulses from the output start of the laser apparatus 3. The traveling direction of the pulsed laser light 31 may be evaluated based on a factor called pointing that indicates variation of the focus position when the pulsed laser light 31 is concentrated by the concentrating optical system.

4. Light Emission Control System Section Including Control of Optical Shutter

First Embodiment 4.1 Configuration

Figure 6:
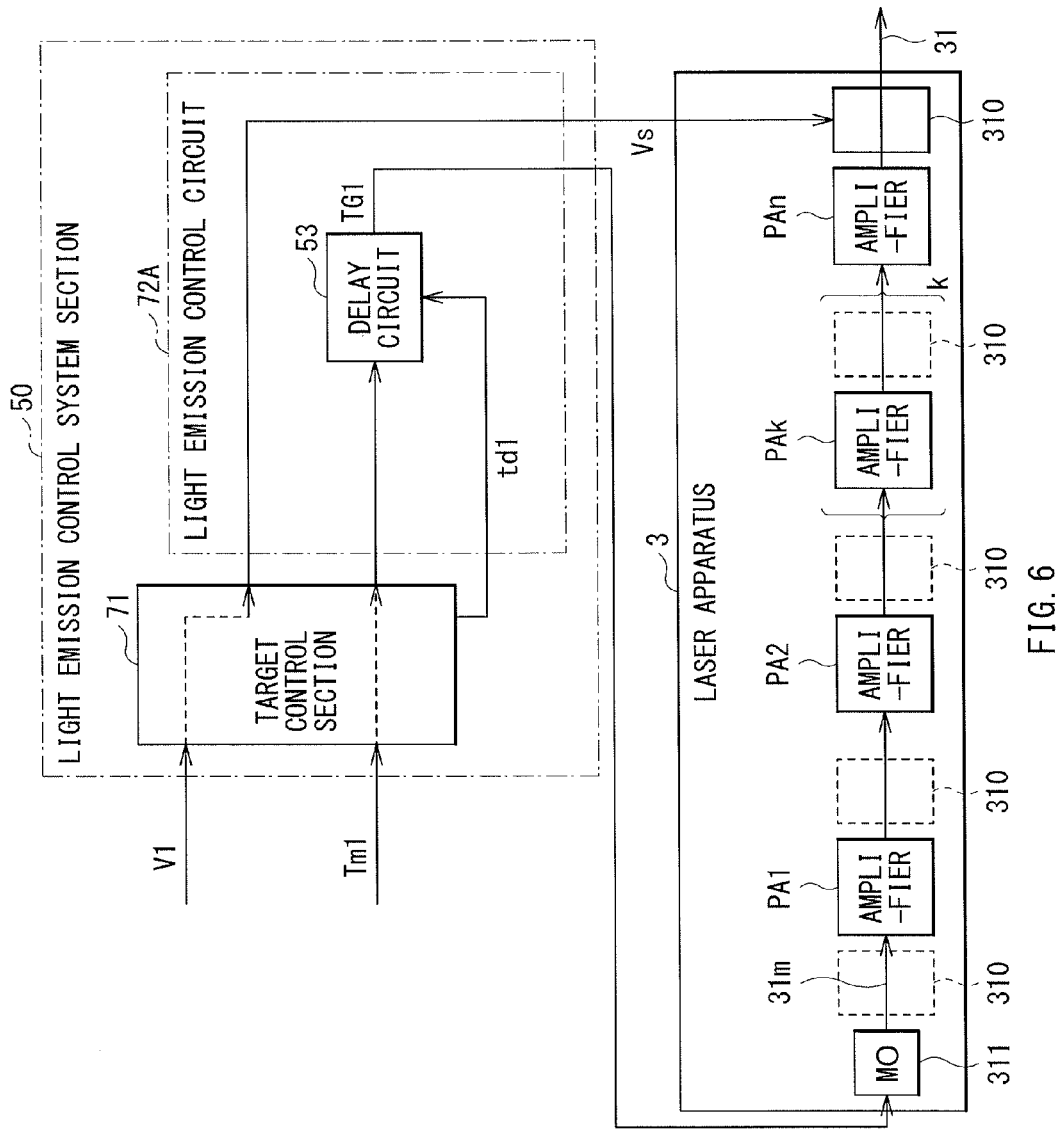
FIG. 6 schematically illustrates a configuration example of a light emission control system section including control of an optical shutter.

FIG. 6 illustrates a configuration example of the light emission control system section 50 that also performs control of an optical shutter 310. As illustrated in FIG. 6, the light emission control system section 50 may include a light emission control circuit 72A in place of the light emission control circuit 72 in FIG. 3. The light emission control circuit 72A does not include the AND circuit 52. The light emission control circuit 72A may be a light emission trigger generating section that supplies the light emission trigger signal TG1 to the laser apparatus 3. The light emission control system section 50 may be a control section that opens and closes the optical shutter 310 based on the burst signal V1.

The laser apparatus 3 may include a master oscillator (MO) 311 and a plurality of amplifiers. The plurality of amplifiers may include a first amplifier PA1, a second amplifier PA2, a k-th amplifier PAk, and an n-th amplifier PAn. The master oscillator 311 may be a $CO_2$ laser including a Q switch or a quantum cascade laser (QCL) that oscillates in an amplification wavelength band of a $CO_2$ laser. Each of the plurality of amplifiers may be an amplifier using $CO_2$ laser gas as laser medium. Each of the plurality of amplifiers may include $CO_2$ laser gas, a pair of electrodes, and a power source that causes high-frequency discharge between the electrodes. The plurality of amplifiers may be disposed in series to one another on an optical path of pulsed laser light 31m that is outputted from the master oscillator 311. The pulsed laser light 31m generated by the master oscillator 311 may be amplified by the first amplifier PA1, and then amplified by the second amplifier PA2, the k-th amplifier PAk, and the n-th amplifier PAn in order. The symbol n used for designation of the amplifier or the optical isolator may indicate the total number of amplifiers or optical isolators, and the symbol k may indicate an ordinal number between 2 to n, thereby identifying the amplifier or the optical isolator.

The optical shutter 310 may be disposed on an optical path between the master oscillator 311 and the plasma generation region 25. When the resistance property of the optical shutter 310 is low against the pulsed laser light 31m or when distortion of the wave surface of the pulsed laser light 31m that has passed through the optical shutter 310 is large, the optical shutter 310 may be preferably disposed on the optical path on a side close to the master oscillator 311. The optical shutter 310 may be preferably disposed on the optical path on upstream side, for example, between the master oscillator 311 and the first amplifier PA1 or between the first amplifier PA1 and the second amplifier PA2.

4.2 Operation

Figure 7:
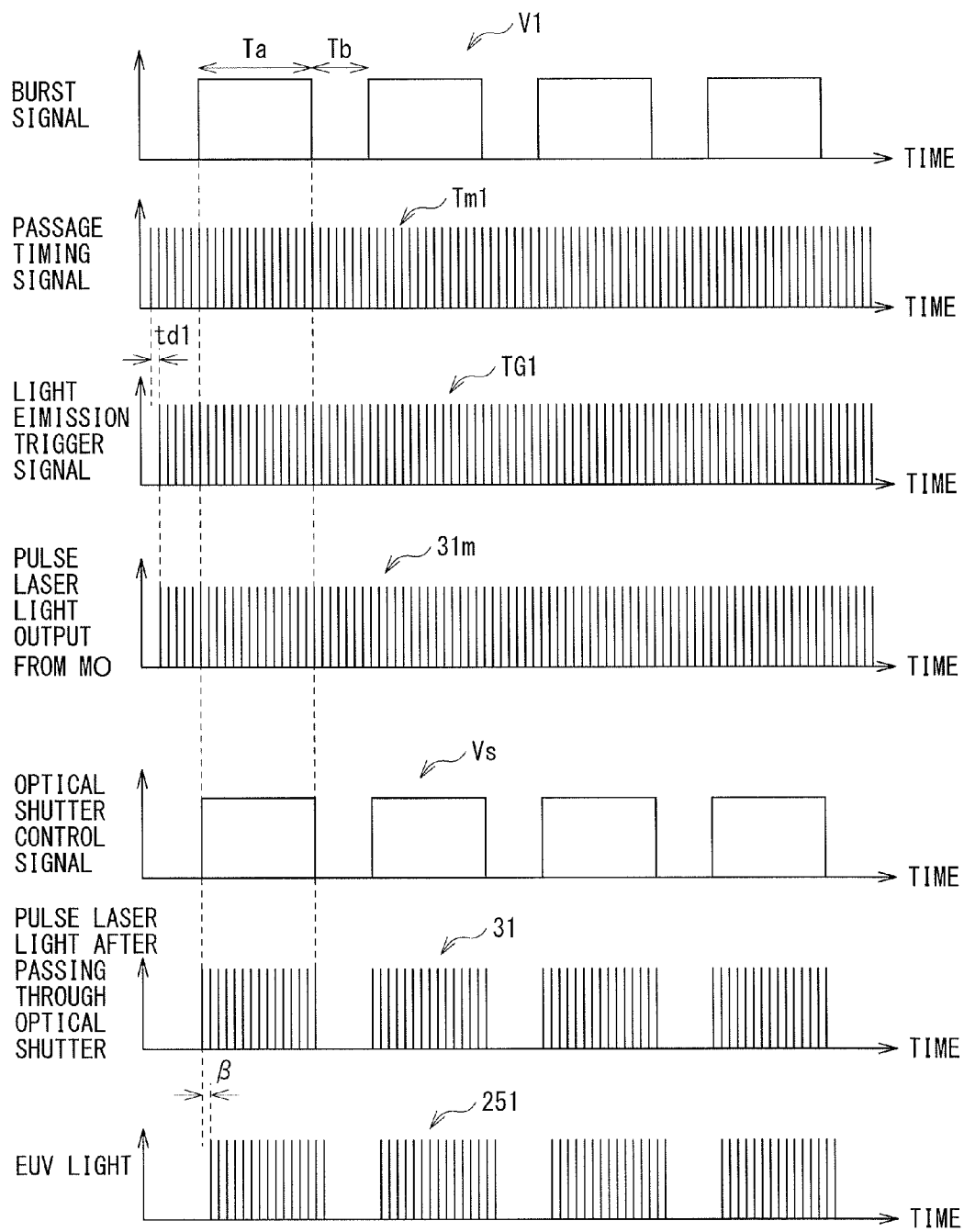
FIG. 7 is a timing chart illustrating an example of timings of light emission control performed by the light emission control system section illustrated in FIG. 6.

FIG. 7 is a timing chart illustrating an example of timings of the light emission control by the light emission control system section 50 illustrated in FIG. 6.

The burst signal V1 outputted from the exposure unit 6 and the passage timing signal Tm1 outputted from the target detection unit 40 may be inputted to the target control section 71. The light emission control circuit 72A may receive the burst signal V1 as illustrated in FIG. 7 through the target control section 71. The light emission control circuit 72A may generate an optical shutter control signal Vs that opens or closes the optical shutter 310, based on the burst signal V1, and then may output the optical shutter control signal Vs to the optical shutter 310. The light emission control circuit 72A may output the burst signal V1 as is, as the optical shutter control signal Vs, as illustrated in FIG. 7. For example, a part where the burst signal V1 becomes High may be regarded as an opening signal to put the optical shutter 310 into the open state. A part where the burst signal V1 becomes Low may be regarded as a closing signal to put the optical shutter 310 into the close state.

The target control section 71 may output the control signal including the setting information of the predetermined delay time td1 to the delay circuit 53. The delay circuit 53 may receive the passage timing signal Tm1 from the target detection unit 40 as illustrated in FIG. 7, through the target control section 71. The delay circuit 53 may delay the passage timing signal Tm1 by the predetermined delay time td1 to generate the light emission trigger signal TG1 as illustrated in FIG. 7, and may output the light emission trigger signal TG1 to the master oscillator 311 of the laser apparatus 3. When the laser apparatus 3 receives the light emission trigger signal TG1, the laser apparatus 3 may output the pulsed laser light 31$m$ from the master oscillator 311 as illustrated in FIG. 7.

As illustrated in FIG. 7, the optical shutter 310 may operate substantially based on the burst signal V1. As a result, the optical shutter 310 may be open during the predetermined period Ta in which the burst signal V1 becomes High, and may allow the pulsed laser light 31$m$ outputted from the master oscillator 311 to pass therethrough at high transmittance. In contrast, the optical shutter 310 may be closed during the predetermined period Tb in which the burst signal V1 becomes Low, and may suppress transmission of the pulsed laser light 31$m$ outputted from the master oscillator 311. As a result, burst pulsed laser light 31 may be outputted from the laser apparatus 3, as illustrated in FIG. 7. The pulsed laser light 31 may be concentrated on the plasma generation region 25 in the chamber 2 through the laser light traveling direction control section 34, etc. The target 27 that has reached the plasma generation region 25 may be irradiated with the pulsed laser light 33, thereby turning into plasma. This may generate the burst EUV light 251 as illustrated in FIG. 7. The pulsed laser light 31 may take time β to reach the plasma generation region 25 from the laser apparatus 3.

Note that the other configuration and operation in the first embodiment may be substantially the same as those of the EUV light generating system illustrated in FIG. 2 and the light emission control system section 50 illustrated in FIG. 3.

4.3 Action

According to the first embodiment, the pulsed laser light 31$m$ may be outputted from the master oscillator 311 at the predetermined repetition frequency irrespective of presence or absence of the burst signal V1. Therefore, the pulse energy and the pointing of the pulsed laser light 31 outputted from the laser apparatus 3 may become stable. Since the optical shutter 310 is opened or closed based on the burst signal V1, stability of the pulses in the vicinity of the head 31$a$ of the burst of the pulsed laser light 31 as illustrated in FIG. 4 and FIG. 5 may be improved. As a result, stability in the vicinity of the head of the burst of the EUV light 251, for example, energy of the EUV light 251, position of the emission point of the EUV light 251, the shape of the plasma, etc. may be improved.

4.4 Modifications

The laser apparatus 3 may not include the plurality of amplifiers but may include only one amplifier. The laser of the laser unit may not be limited to the $CO_2$ laser but may be solid-state laser such as YAG laser. Examples of the laser may include Ti:sapphire laser, Nd:YAG laser, Nd:YLF laser, and Nd:YVO4 laser. When the output of the laser apparatus 3 is sufficiently covered by the master oscillator 311, the amplifier may be omitted. When the master oscillator 311 is QCL, the first amplifier PA1 may be a reproduction amplifier.

In the present embodiment, the light emission control circuit 72A is configured of a logic circuit; however, the configuration is not limited thereto. Alternatively, a similar function may be achieved by programmable field-programmable gate array (FPGA).

The method of feeding the target 27 is not limited to the example of the droplet generation by the continuous jet (CJ) method, and may be on-demand method such as electrostatic pull-out method. In the case of the on-demand method, a signal to generate droplet on demand may be used to generate the light emission trigger signal TG1, in place of the passage timing signal Tm1. Specific example of the on-demand method of feeding the target 27 will be described with reference to FIG. 13.

Figure 8:
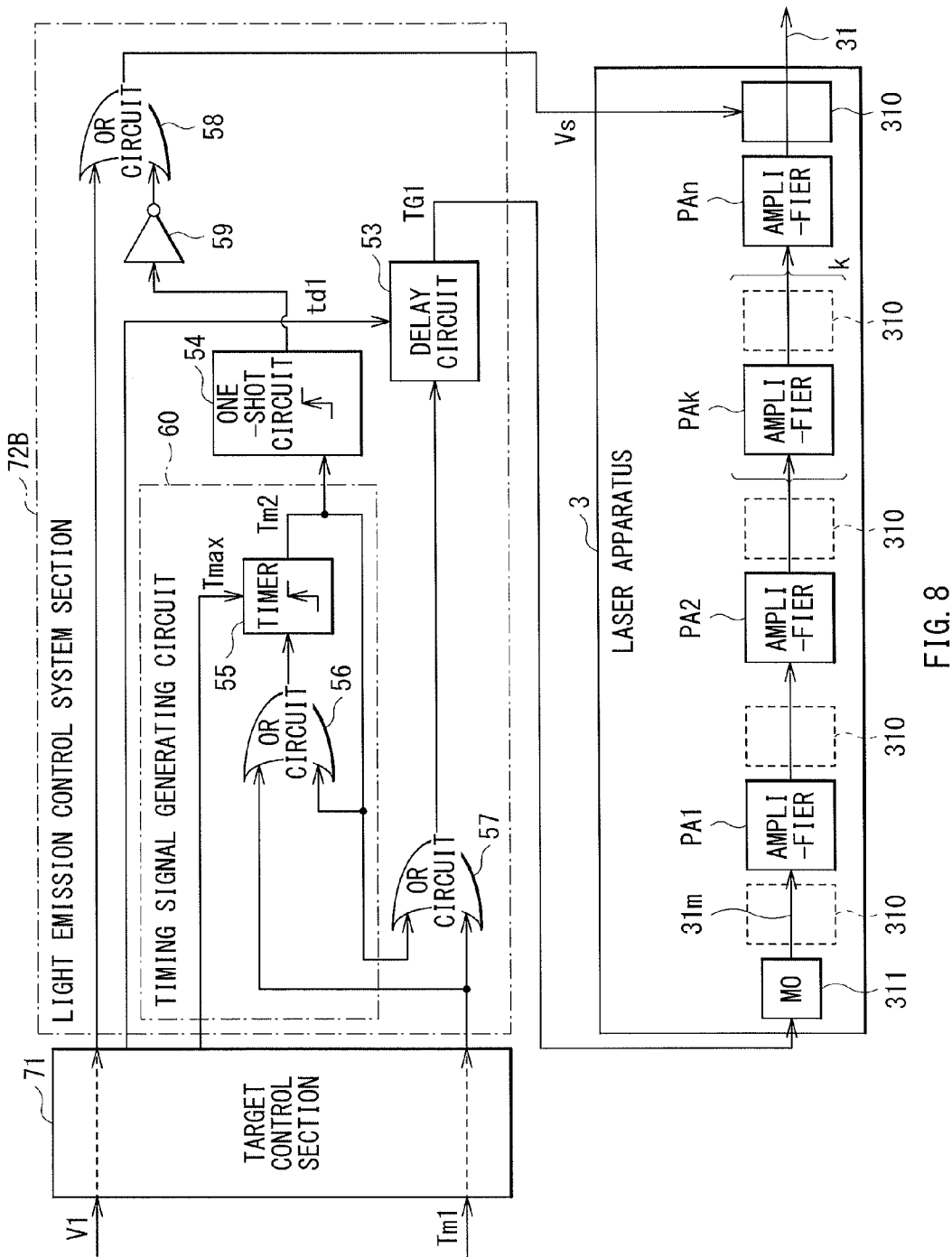
FIG. 8 schematically illustrates a configuration example of a light emission control system section including a timing signal generating circuit.

5. Light Emission Control System Section Including Timing Signal Generating Circuit Second Embodiment 5.1 Configuration FIG. 8 illustrates a configuration example of a light emission control system section including a timing signal generating circuit 60. As illustrated in FIG. 8, the light emission control system section may include a light emission control circuit 72B that includes the timing signal generating circuit 60, in place of the light emission control circuit 72A in FIG. 6. The light emission control circuit 72B may be a light emission trigger generating section that supplies the light emission trigger signal TG1 to the laser apparatus 3. The timing signal generating circuit 60 may include a timer 55 and a first OR circuit 56. The light emission control circuit 72B may further include the delay circuit 53, a one-shot circuit 54, a second OR circuit 57, a third OR circuit 58, and an inverter 59.

The first OR circuit 56 and the second OR circuit 57 may receive the passage timing signal Tm1 from the target detection unit 40 through the target control section 71. An output signal of the first OR circuit 56 may be inputted to the timer 55. An output signal of the timer 55 may be inputted to the one-shot circuit 54, the first OR circuit 56, and the second OR circuit 57.

An output signal of the one-shot circuit 54 may be inputted to the third OR circuit 58 through the inverter 59. A length of a pulse width Tsh of the output signal of the one-shot circuit 54 may be set to be longer than a time in which the pulsed laser light 31$m$ passes through the optical shutter 310 after the light emission trigger signal TG1 is inputted to the master oscillator 311. The third OR circuit 58 may receive the burst signal V1 through the target control section 71. The third OR circuit 58 may output the optical shutter control signal Vs as the output signal to the optical shutter 310.

5.2 Operation

Figure 9:
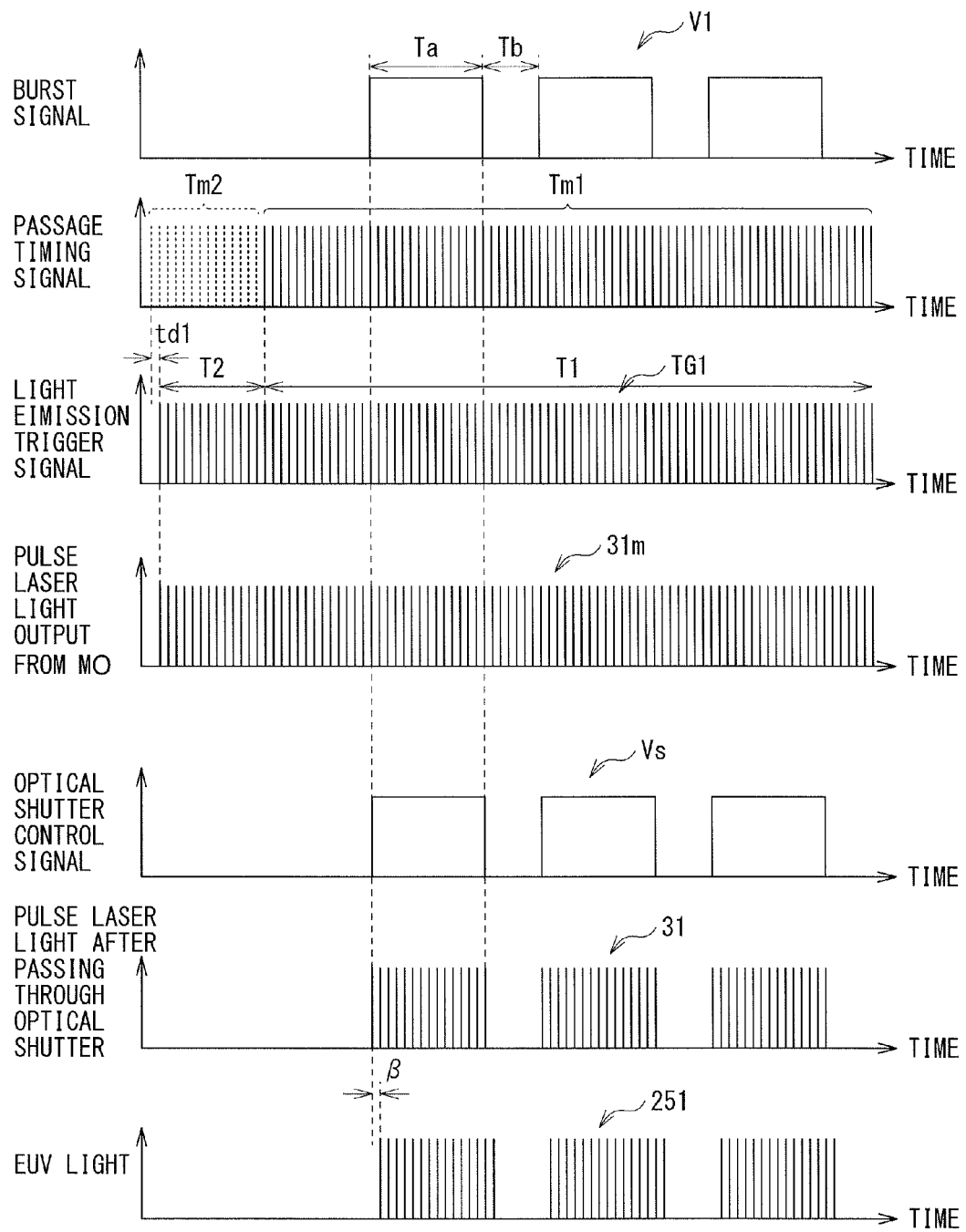
FIG. 9 is a timing chart illustrating an example of timings of light emission control performed by the light emission control system section illustrated in FIG. 8.

FIG. 9 is a timing chart illustrating an example of timings of the light emission control by the light emission control system section illustrated in FIG. 8.

The target control section 71 may output the control signal including the setting information of the predetermined delay time td1 to the delay circuit 53. The target control section 71 may also output the control signal including the setting information of the maximum time Tmax to the timer 55. Here, the maximum time Tmax may be a value close to and slightly larger than a generation interval t of the droplet target 27. For example, when the generation interval t of the droplet target 27 is 9.9 μs to 10.1 μs, the maximum time Tmax may be a fixed value between 10.11 μs and 10.15 μs.

The passage timing signal Tm1 from the target detection unit 40 may be inputted to the first OR circuit 56 and the second OR circuit 57 through the target control section 71. The passage timing signal Tm1 may pass through the first OR circuit 56 to reset the timer 55. The timer 55 then may start measurement of time. Further, the passage timing signal Tm1 may be inputted to the delay circuit 53 after passing through the second OR circuit 57. Here, when the interval T of the passage timing signal Tm1 is larger than the maximum time Tmax, a pulse signal to be a dummy passage timing signal Tm2 may be outputted from the timer 55. The dummy passage timing signal Tm2 may be inputted to the first OR circuit 56, the second OR circuit 57, and the one-shot circuit 54. Here, the passage timing signal Tm1 may be a first timing signal indicating feed timing of the target 27. The dummy passage timing signal Tm2 may be a second timing signal.

The dummy passage timing signal Tm2 from the timer 55 may pass through the first OR circuit to reset and start the timer 55. Also, the dummy passage timing signal Tm2 from the timer 55 may be inputted to the delay circuit 53 through the second OR circuit 57. The delay circuit 53 may delay the passage timing signal Tm1 or the dummy passage timing signal Tm2 by the predetermined delay time td1 to generate the light emission trigger signal TG1 as illustrated in FIG. 9. The delay circuit 53 may output the light emission trigger signal TG1 to the master oscillator 311 of the laser apparatus 3. When the laser apparatus 3 receives the light emission trigger signal TG1, the laser apparatus 3 may output the pulsed laser light 31m from the master oscillator 311 as illustrated in FIG. 9. In this way, the light emission trigger signal TG1 may be generated based on any of the passage timing signal Tm1 as the first timing signal and the dummy passage timing signal Tm2 as the second timing signal. As illustrated in FIG. 9, the light emission trigger signal TG1 based on the dummy passage timing signal Tm2 may be generated during the period T2, and the light emission trigger signal TG1 based on the passage timing signal Tm1 from the target detection unit 40 may be generated during the period T1.

When the laser apparatus 3 receives the light emission trigger signal TG1, the laser apparatus 3 may output the pulsed laser light 31m from the master oscillator 311 as illustrated in FIG. 9. When the dummy passage timing signal Tm2 from the timer 55 is inputted to the one-shot circuit 54, a pulse signal having a predetermined length Tsh may be outputted from the one-shot circuit 54. The pulse signal outputted from the one-shot circuit 54 may be inputted, as the optical shutter control signal Vs, to the optical shutter 310 through the inverter 59. As a result, transmission of the pulsed laser light 31m outputted from the master oscillator 311 by the light emission trigger signal TG1 based on the dummy passage timing signal Tm2 from the timer 55 may be suppressed by the optical shutter 310.

As illustrated in FIG. 9, the optical shutter 310 may also operate substantially in response to the burst signal V1. As a result, the optical shutter 310 may be put into the open state during the predetermined period T1 in which the burst signal V1 becomes High, and may allow the pulsed laser light 31m from the master oscillator 311 to pass therethrough at high transmittance. The optical shutter 310 may be put into the closed state during the predetermined period Tb in which the burst signal V1 becomes Low, and may suppress transmission of the pulsed laser light 31m from the master oscillator 311. As a result, the burst pulsed laser light 31 may be outputted from the laser apparatus 3 as illustrated in FIG. 9. The pulsed laser light 31 may be concentrated on the plasma generation region 25 in the chamber 2 through the laser light traveling direction control section 34 and the like. The target 27 reached the plasma generation region 25 may be irradiated with the pulsed laser light 33 to turn into plasma, and may generate the burst EUV light 251 as illustrated in FIG. 9. The pulsed laser light 31 may take time β to reach the plasma generation region 25 from the laser apparatus 3.

Note that the other configuration and operation in the second embodiment may be substantially the same as those in the first embodiment.

5.3 Action

According to the second embodiment, the light emission trigger signal TG1 with the predetermined interval Tmax may be generated based on the dummy passage timing signal Tm2 from the timer 55 even during the period in which the passage timing signal Tm1 from the target detection unit 40 is not provided. As a result, the pulsed laser light 31m may be continuously outputted from the master oscillator 311. Since the optical shutter 310 is closed during the period in which the pulsed laser light 31m is outputted based on the dummy passage timing signal Tm2, it may be possible to suppress transmission of the pulsed laser light 31m through the optical shutter 310. As a result, even when the passage timing signal Tm1 is not provided from the target detection unit 40, the pulsed laser light 31m may be outputted from the master oscillator 311. This may make it possible to reduce warm-up time of the laser apparatus 3. Also in the case where the droplet target 27 is unstably generated, it may be possible to maintain stability of the pulsed laser light 31 outputted from the laser apparatus 3.

5.4 Modifications

In the second embodiment, the optical shutter control signal Vs based on the dummy passage timing signal Tm2 may be generated by the one-shot circuit 54, the third OR circuit 58, and the inverter 59; however, these circuits may be omitted. In such a case, the light emission control circuit 72B may output the burst signal V1 as is as the optical shutter control signal Vs similarly to the light emission control circuit 72A in FIG. 6.

6. Light Emission Control System Section Including Control of Optical Isolator

Third Embodiment 6.1 Configuration

Figure 10:
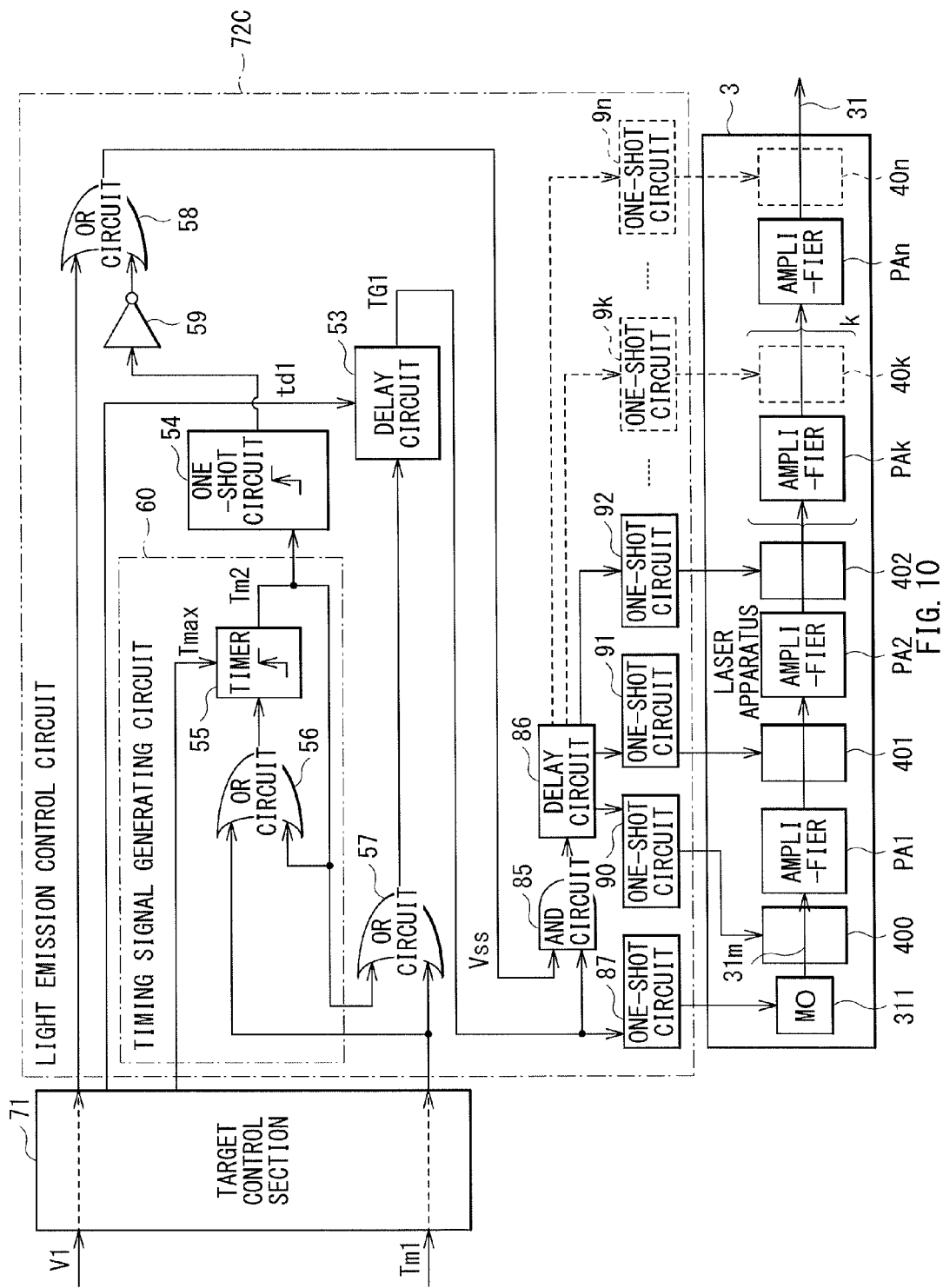
FIG. 10 schematically illustrates a configuration example of a light emission control system section including control of an optical isolator.

FIG. 10 illustrates a configuration example of a light emission control system section including control of an optical isolator. As illustrated in FIG. 10, the light emission control system section may include a light emission control circuit 72C in place of the light emission control circuit 72B in FIG. 8. The light emission control circuit 72C may be a light emission trigger generating section that supplies the light emission trigger signal TG1 to the laser apparatus 3.

The light emission control circuit 72C may control a plurality of optical isolators in place of the optical shutter 310. The plurality of optical isolators may be disposed on the optical path between the master oscillator 311 and the plasma generation region 25. The plurality of optical isolators may include an optical isolator 400, an optical isolator 401, an optical isolator 402, an optical isolator 40k, and an optical isolator 40n. The optical isolator 400 may be disposed between the master oscillator 311 and the first amplifier PA1. The optical isolator 401 may be disposed between the first amplifier PA1 and the second amplifier PA2. The optical isolator 402 may be disposed between the second amplifier PA2 and the k-th amplifier PAk. The optical isolator 40k may be disposed between the k-th amplifier PAk and the n-th amplifier PAn.

The light emission control circuit 72C may include an AND circuit 85, a delay circuit 86, a one-shot circuit 87, a plurality of one-shot circuits 90, 91, 9k, and 9n, in addition to the components of the light emission control circuit 72B in FIG. 8.

The delay circuit 53 may output the light emission trigger signal TG1 to the AND circuit 85 and the one-shot circuit 87. The third OR circuit 58 may output an optical isolator control signal Vss to open and close each of the plurality of optical isolators 400, 401, 402, 40k, and 40n, to the AND circuit 85. The output signal from the AND circuit 85 may be inputted to the delay circuit 86. The delay circuit 86 may be coupled to the plurality of optical isolators 400, 401, 402, 40k, and 40n through the plurality of one-shot circuits 90, 91, 92, 9k, and 9n, respectively. A pulse width of the output signal of each of the plurality of one-shot circuits 90, 91, 92, 9k, and 9n may be set to be equal to or larger than the pulse width of the pulsed laser light 31m outputted from the master oscillator 311. The delay time of the delay circuit 86 with respect to the plurality of one-shot circuits 90, 91, 92, 9k, and 9n may be set so as to be synchronized with respective timings at which the pulsed laser light 31m passes through the plurality of optical isolators 400, 401, 402, 40k, and 40n.

6.2 Operation

The plurality of amplifiers PA1, PA2, PAk, and PAn each may control an unillustrated power source to continuously excite $CO_2$ laser gas. When receiving the light emission trigger signal TG1 from the delay circuit 53, the one-shot circuit 87 may output a pulse signal having a pulse width that is adjusted so as to provide the pulsed laser light 31m having the predetermined pulse width. The master oscillator 311 may operate the Q switch in response to the input of the pulse signal. As a result, the pulsed laser light 31m having the predetermined pulse width may be outputted from the master oscillator 311. When the opening signal as the optical isolator control signal Vss is inputted to the AND circuit 85 from the third OR circuit 58, the light emission trigger signal TG1 may be inputted to the delay circuit 86. The plurality of one-shot circuits 90, 91, 92, 9k, and 9n may output respective pulse signals that open the plurality of optical isolators 400, 401, 402, 40k, and 40n, respectively, with different delay time defined by the delay circuit 86. As a result, the pulsed laser light 31m may pass through the plurality of optical isolators 400, 401, 402, 40k, and 40n at high transmittance, and the pulsed laser light 31m may be amplified by the plurality of amplifiers PA1, PA2, PAk, and PAn. When the opening signal is not inputted to the AND circuit 85 as the optical isolator control signal Vss, the pulse signals that respectively open the plurality of optical isolators 400, 401, 402, 40k, and 40n may not be outputted. As a result, each of the plurality of optical isolators 400, 401, 402, 40k, and 40n may suppress transmission of the pulsed laser light 31m.

Figure 11:
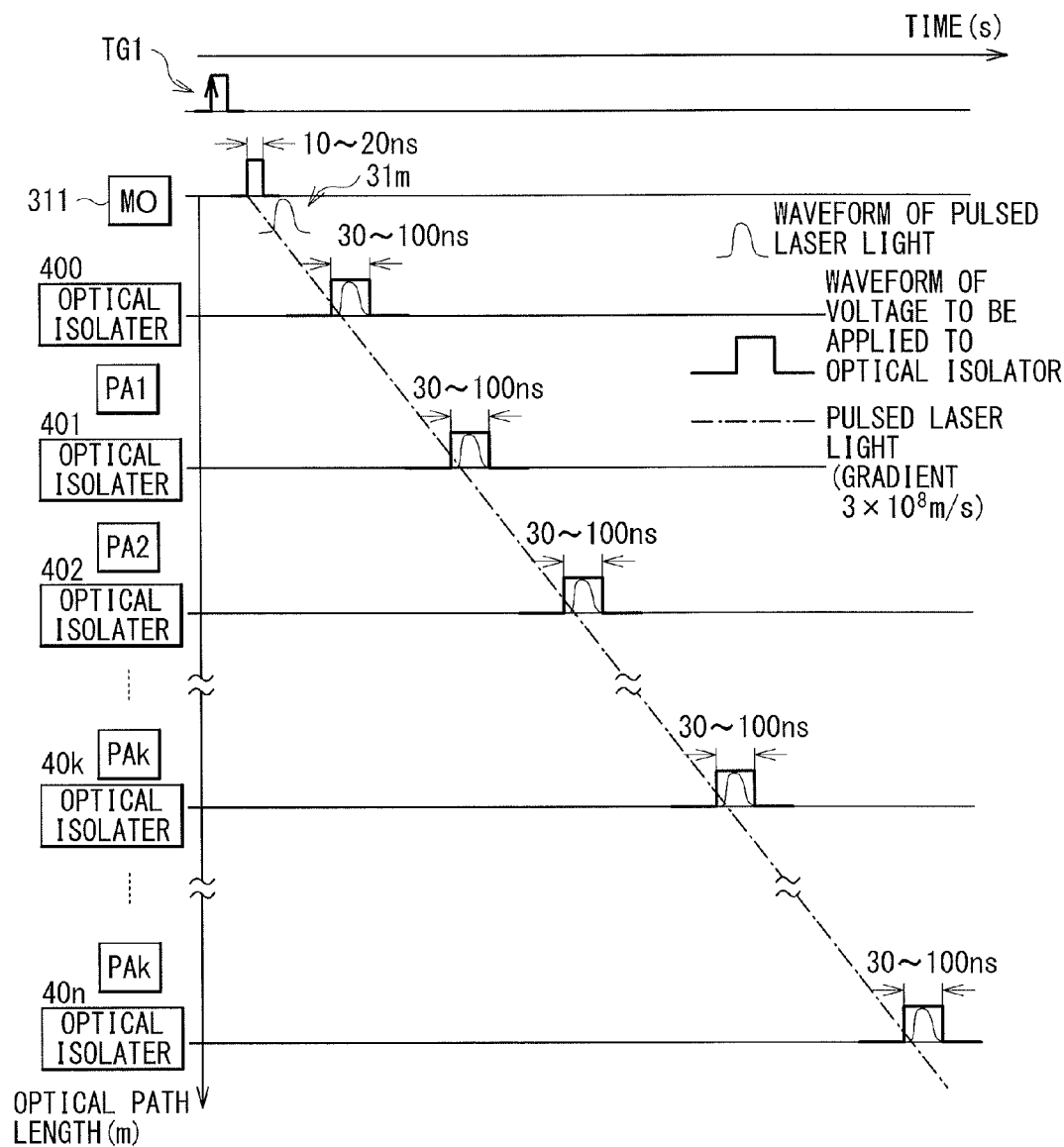
FIG. 11 is a timing chart illustrating an example of timings of light emission control performed by the light emission control system section illustrated in FIG. 10.

FIG. 11 is a timing chart illustrating an example of the timings of the light emission control by the light emission control system section illustrated in FIG. 10. In FIG. 11, a vertical axis may conceptually indicate a length of the optical path between the master oscillator 311 of the laser apparatus 3 and the optical isolator 40n. A horizontal axis may indicate time. The length of the optical path between the master oscillator 311 and the optical isolator 40n may be 50 m to 200 m.

When the light emission trigger signal TG1 is inputted to the master oscillator 311, the Q switch may be operated in synchronization with the input of the light emission trigger signal TG1 and the pulsed laser light 31m having the predetermined pulse width in a range from 10 nm to 20 nm, for example, may be accordingly outputted. The pulsed laser light 31m outputted from the master oscillator 311 may travel on the optical path at the light speed of $3\times10^8$ m/s. Each of the plurality of optical isolators 400, 401, 402, 40k, and 40n may be so controlled as to open at the disposed position immediately before the pulsed laser light 31m pass therethrough. For example, in a case where the optical isolator includes electrooptical (EO) crystal Pockels cell, applying a predetermined voltage to the Pockels cell may put each of the plurality of optical isolators 400, 401, 402, 40k, and 40n into the open state. Immediately after the pulsed laser light 31m passes through the optical isolator, the voltage applied to the Pockels cell may be made 0 V to put the plurality of optical isolators 400, 401, 402, 40k, and 40n into the closed state. The pulse width of the signal putting each of the plurality of optical isolators 400, 401, 402, 40k, and 40n into the open state may be in a range from 30 ns to 100 ns, for example.

Note that the other configuration and operation in the third embodiment may be substantially the same as those in the first or second embodiment.

6. 3 Action

According to the third embodiment, in addition to the action of the above-described second embodiment, the plurality of optical isolators 400, 401, 402, 40k, and 40n may be caused to function. This may make it possible to suppress self-oscillation of the laser apparatus 3. Accordingly, it may be possible to maintain the state where the plurality of amplifiers PA1, PA2, PAk, and PAn are continuously excited. As a result, the pulse energy and the pointing of the pulsed laser light 31 outputted from the laser apparatus 3 may become stable as compared with the case where the plurality of amplifiers PA1, PA2, PAk, and PAn are not maintained to the excited state.

6.4 Modifications

In the above-described embodiment, the optical isolators are disposed all of the optical paths on the upstream side and the downstream side of each of the plurality of amplifiers PA1, PA2, PAk, and PAn; however, an optical isolator may be disposed on a part of the optical paths. For example, when the optical isolator has low resistance to the pulsed laser light 31m or when the distortion of the wave surface of the transmitted pulsed laser light 31m is large, the optical isolator may be preferably disposed on the optical path on the upstream side. For example, the optical isolator may be disposed on the optical path on the upstream side, for example, between the master oscillator 311 and the first amplifier PA1, or between the first amplifier PA1 and the second amplifier PA2.

Figure 12:
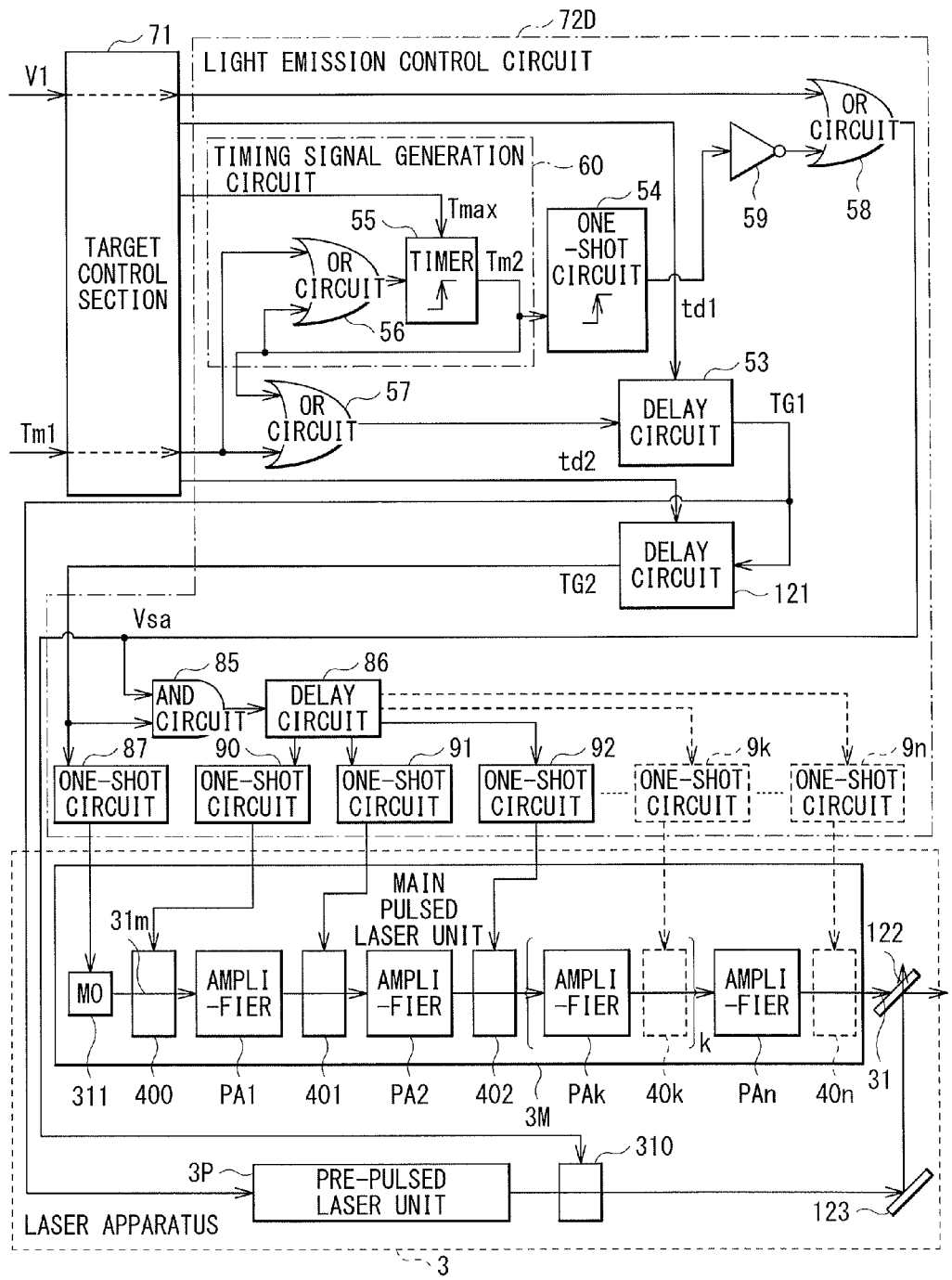
FIG. 12 schematically illustrates a configuration example of a light emission control system section including control of a pre-pulsed laser unit.

7. Light Emission Control System Section Including Control of Pre-Pulsed Laser Unit Fourth Embodiment 7.1 Configuration FIG. 12 illustrates a configuration example of a light emission control system section including control of a pre-pulsed laser unit. As illustrated in FIG. 12, the light emission control system section may include a light emission control circuit 72D in place of the light emission control circuit 72C in FIG. 10. The light emission control circuit 72D may be a light emission trigger generating section supplying the light emission trigger signal to the laser apparatus 3.

The laser apparatus 3 may include a main pulsed laser unit 3M, a pre-pulsed laser unit 3P, a dichroic mirror 122, and a high-reflection mirror 123. The main pulsed laser unit 3M may have a configuration substantially the same as that of the laser apparatus 3 in FIG. 10. The dichroic mirror 122 may be disposed on an optical path of the pulsed laser light 31 from the main pulsed laser unit 3M. The high-reflection mirror 123 may be disposed on an optical path of pre-pulsed laser light from the pre-pulsed laser unit 3P. The dichroic mirror 122 may be a diamond substrate coated with a film that allows the pulsed laser light 31 from the main pulsed laser unit 3M to pass therethrough at high transmittance and reflects the pre-pulsed laser light from the pre-pulsed laser unit 3P at high reflectivity. The dichroic mirror 122 may be disposed so that the optical path of the pre-pulsed laser light reflected by the high reflection mirror 123 is substantially coincident with the optical path of the pulsed laser light 31 from the main pulsed laser unit 3M.

The pre-pulsed laser unit 3P may be a solid-state laser unit such as YAG laser. The optical shutter 310 may be disposed on the optical path of the pre-pulsed laser light between the pre-pulsed laser unit 3P and the high-reflection mirror 123. Before the target 27 in the chamber 2 is irradiated with the pulsed laser light 31 from the main pulsed laser unit 3M, the target 27 may be irradiated with the pre-pulsed laser light from the pre-pulsed laser unit 3P. The optical path of the pre-pulsed laser light and the optical path of the pulsed laser light 31 may be adjusted so that the target 27 that has been irradiated with the pre-pulsed laser light is irradiated with the pulsed laser light 31 from the main pulsed laser unit 3M.

The light emission control circuit 72D may further include a delay circuit 121 in addition to the components of the light emission control circuit 72C in FIG. 10. The delay circuit 53 may output the light emission trigger signal TG1 to the delay circuit 121 and the pre-pulsed laser unit 3P. The target control section 71 may output a control signal including setting information of the predetermined delay time td2 to the delay circuit 121. The delay circuit 121 may output the light emission trigger signal TG2 to the AND circuit 85 and the one-shot circuit 87. The third OR circuit 58 may output the control signal Vsa as the output signal to the AND circuit 85 and the optical shutter 310. The control signal Vsa may be a signal to perform opening-closing control of the plurality of optical isolators 400, 401, 402, 40k, and 40n and opening-closing control of the optical shutter 310.

The one-shot circuit 54 may output a pulse signal having a pulse width Tsh2. The pulse signal outputted from the one-shot circuit 54 may be inputted to the optical shutter 310 as the control signal Vsa through the inverter 59. The pulse width Tsh2 may be equal to or longer than a time in which the pulsed laser light 31m is outputted from the master oscillator 311 of the main pulsed laser unit 3M after the dummy passage timing signal Tm2 is provided from the timer 55.

7.2 Operation

The target control section 71 may output the control signal including the setting information of the predetermined delay time td1 to the delay circuit 53. The target control section 71 may also output the control signal including the setting information of the maximum time Tmax to the timer 55. The maximum time Tmax may be a value close to and slightly larger than the generation interval t of the droplet target 27.

The passage timing signal Tm1 may be inputted to the delay circuit 53 after passing through the second OR circuit 57. When an interval T of the passage timing signal Tm1 is larger than the maximum time Tmax, a pulse signal to be the dummy passage timing signal Tm2 may be outputted from the timer 55. The delay circuit 53 may delay the dummy passage timing signal Tm2 by the predetermined delay time td1 to generate the light emission trigger signal TG1. The delay circuit 53 may output the light emission trigger signal TG1 to the delay circuit 121 and the pre-pulsed laser unit 3P. When receiving the light emission trigger signal TG1, the pre-pulsed laser unit 3P may output the pre-pulsed laser light. The delay circuit 121 may delay the light emission trigger signal TG1 by the predetermined delay time td2 to generate the light emission trigger signal TG2. The light emission trigger signal TG2 may be inputted to the AND circuit 85 and the one-shot circuit 87. As a result, the pulsed laser light 31m may be outputted from the master oscillator 311 of the main pulsed laser unit 3M, based on the light emission trigger signal TG2.

When the dummy passage timing signal Tm2 from the timer 55 is inputted to the one-shot circuit 54, the pulse signal having the predetermined pulse width Tsh2 may be outputted from the one-shot circuit 54. The pulse signal outputted from the one-shot circuit 54 may be inputted to the AND circuit 85 and the optical shutter 310, as the control signal Vsa, through the inverter 59. As a result, during the period in which the dummy passage timing signal Tm2 is outputted, the plurality of optical isolators and the optical shutter 310 may be put into the closed state. As a result, transmission of the pulsed laser light 31m outputted from the master oscillator 311 of the main pulsed laser unit 3M may be suppressed by the plurality of optical isolators. Further, transmission of the pre-pulsed laser light outputted from the pre-pulsed laser unit 3P may be suppressed by the optical shutter 310. As a result, it may be possible to suppress generation of the EUV light 251.

In the case where the interval T of the passage timing signal Tm1 is equal to or smaller than the maximum time Tmax, when the opening signal is inputted to the AND circuit 85 and the optical shutter 310, as the control signal Vsa from the third OR circuit 58, the plurality of optical isolators 400, 401, 402, 40k, and 40n and the optical shutter 310 may be put into the open state at appropriate timings. As a result, the pulsed laser light 31m outputted from the master oscillator 311 of the main pulsed laser unit 3M may pass through the plurality of optical isolators 400, 401, 402, 40k, and 40n at high transmittance. As a result, before the target 27 in the chamber 2 is irradiated with the pulsed laser light 31 from the main pulsed laser unit 3M, the target 27 may be irradiated with the pre-pulsed laser light from the pre-pulsed laser unit 3P. The target 27 may be dispersed by being irradiated with the pre-pulsed laser light. When the dispersed target 27 is irradiated with the pulsed laser light 31 from the main pulsed laser unit 3M, the EUV light 251 may be generated.

Note that the other configuration and operation in the fourth embodiment may be substantially the same as those in any of the first to third embodiments.

7.3 Action

According to the fourth embodiment, the pulsed laser light 31m may be outputted from the master oscillator 311 of the main pulsed laser unit 3M during the period in which the dummy passage timing signal Tm2 is outputted; however, transmission of the pulsed laser light 31m may be suppressed by the plurality of optical isolators during the period. Also, the pre-pulsed laser light may be outputted from the pre-pulsed laser unit 3P during the period; however, transmission of the pre-pulsed laser light may be suppressed by the optical shutter 310. As a result, it may be possible to suppress application of the pulsed laser light to the plasma generation region 25 from the main pulsed laser unit 3M and the pre-pulsed laser unit 3P during the period.

8. Light Emission Control System Section Including Control of Target in on-Demand Target Feeding Section

Fifth Embodiment

8.1 Configuration

Figure 13:
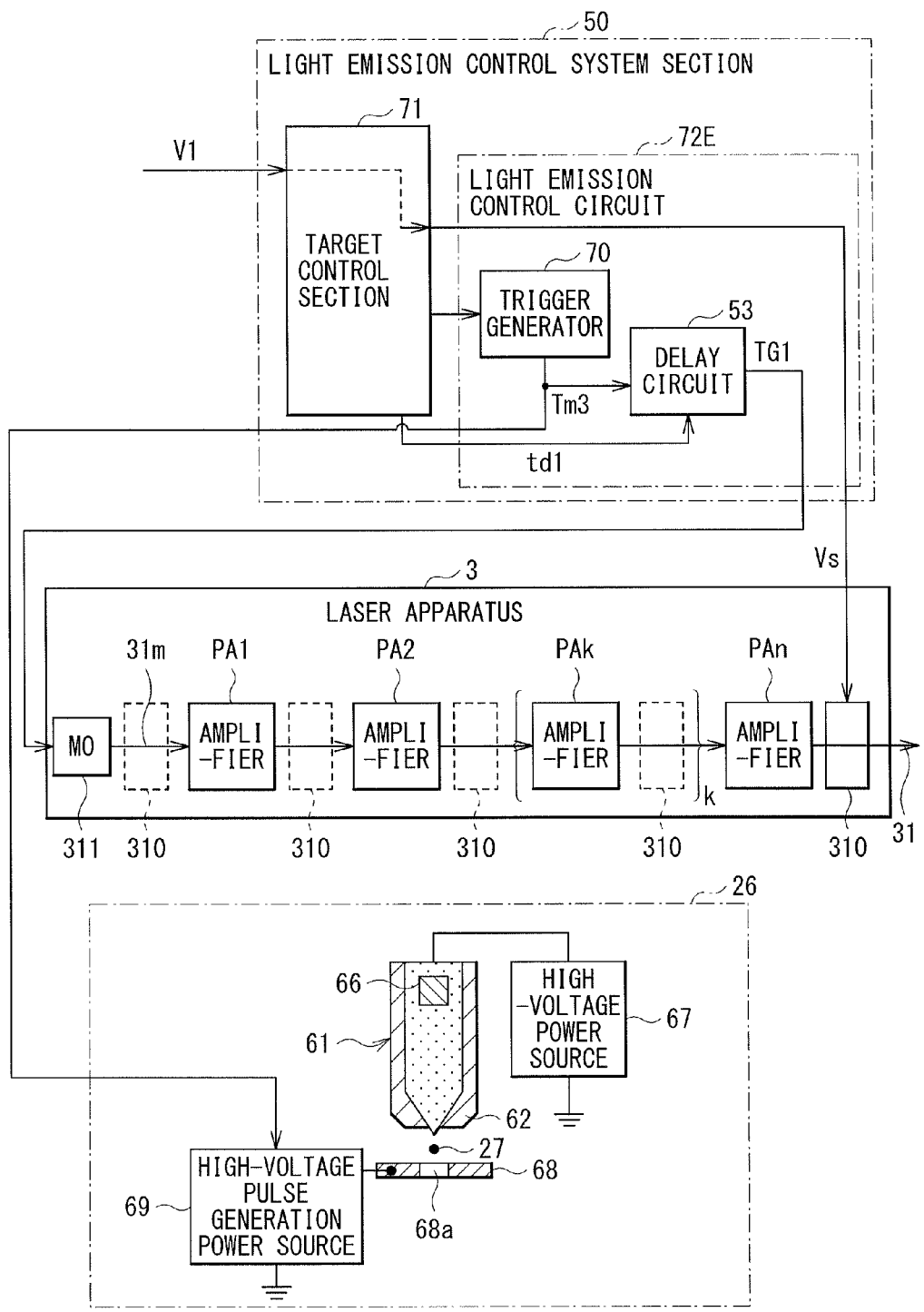
FIG. 13 schematically illustrates a configuration example of a light emission control system section including control of a target in an on-demand target feeder.

FIG. 13 illustrates a configuration example of a light emission control system section including control of a target in an on-demand target feeder. As illustrated in FIG. 13, the light emission control system section 50 may include a light emission control circuit 72E including a trigger generator 70, in place of the light emission control circuit 72A in FIG. 6. The light emission control circuit 72E may be a light emission trigger generating section supplying the light emission trigger signals TG1 and TG2 to the laser apparatus 3. The delay circuit 53 may receive a trigger signal Tm3 from the trigger generator 70 in place of the passage timing signal Tm1.

The target feeder 26 may output the target 27 on demand. The target feeder 26 may include the tank 61, the nozzle 62, an electrode 66, a high-voltage power source 67, an extraction electrode 68, and a high-voltage pulse generation power source 69.

The electrode 66 may be electrically coupled to a target substance in the tank 61 by being in contact with the target substance stored in the tank 61. The electrode 66 may further be electrically coupled to an output terminal of the high-voltage power source 67. A potential to be applied to the electrode 66 may be in a range from 10 kV to 20 kV.

The extraction electrode 68 may be a ring electrode including a through hole 68a through which the target 27 passes. The extraction electrode 68 may be electrically coupled to an output terminal of the high-voltage pulse generation power source 69.

The trigger signal Tm3 from the trigger generator 70 may be inputted to the high-voltage pulse generation power source 69 and the delay circuit 53. The trigger signal Tm3 may be a feeding trigger signal instructing feeding of the target 27. The trigger generator 70 may be a feeding trigger generating section that generates the feeding trigger signal and outputs the feeding trigger signal to the target feeder 26.

8.2 Operation

The target control section 71 may output, to the trigger generator 70, a control signal to allow the trigger generator 70 to generate a pulse signal of a predetermined frequency. The trigger generator 70 may output the generated pulse signal as the trigger signal Tm3 to the high-voltage pulse generation power source 69 and the delay circuit 53. The delay circuit 53 may delay the trigger signal Tm3 by the predetermined delay time td1 to generate the light emission trigger signal TG1, and may output the light emission trigger signal TG1 to the master oscillator 311 of the laser apparatus 3. As a result, the master oscillator 311 may output the pulsed laser light 31m with the predetermined repetition frequency generated by the trigger generator 70.

When receiving the trigger signal Tm3 from the trigger generator 70, the high-voltage pulse generation power source 69 may drop the potential of the extraction electrode 68 by, for example, −5 kV, in synchronization with the trigger signal Tm3. At this time, the target substance may be extracted from a nozzle hole of the nozzle 62 by Coulomb force. When the Coulomb force becomes larger than surface tension, the droplet target 27 may be formed. The droplet target 27 may be generated in such a way in synchronization with the trigger signal Tm3 from the trigger generator 70.

Note that the other configuration and operation in the fifth embodiment may be substantially the same as those in any of the first to fourth embodiments.

8.3 Action

According to the fifth embodiment, the burst EUV light 251 may be generated in a state where the pulsed laser light 31m is continuously outputted from the master oscillator 311 at the predetermined repetition frequency even if the target detection unit 40 is not provided.

9. Others

9.1 Configuration Example of Optical Shutter 310

Figure 14:
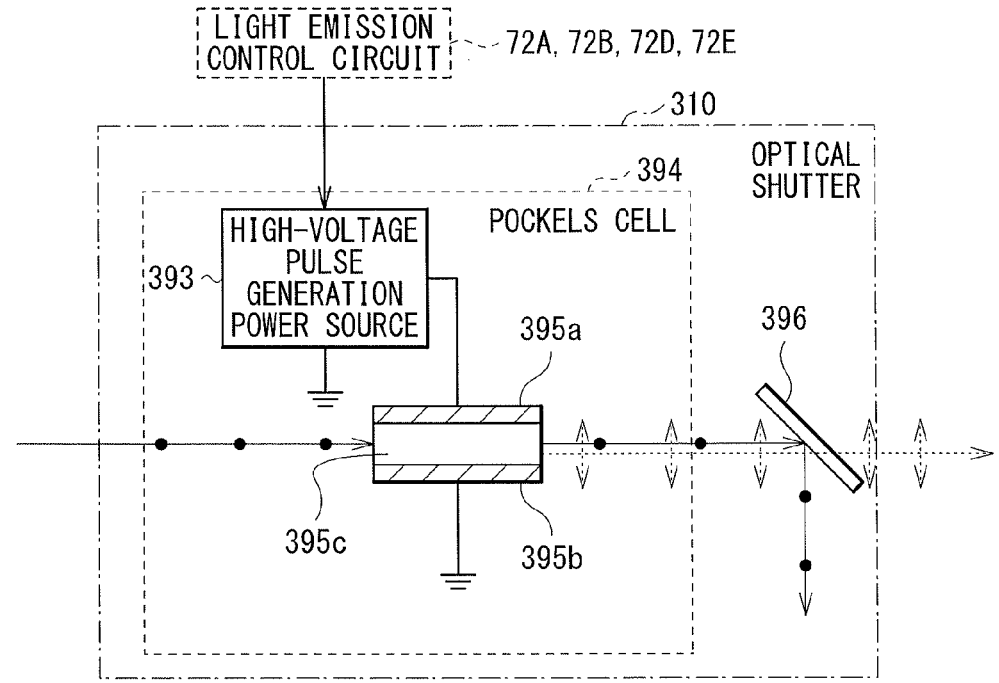
FIG. 14 schematically illustrates a configuration example of an optical shutter.

FIG. 14 illustrates a configuration example of the optical shutter 310. The optical shutter 310 may include a Pockels cell 394 and a polarizer 396. The Pockels cell 394 may include a high-voltage power source 393, a first electrode 395a, a second electrode 395b, and an electrooptical crystal 395c. The first electrode 395a and the second electrode 395b may be oppositely disposed and the electrooptical crystal 395c may be disposed therebetween.

The high-voltage power source 393 may receive the control signal of the optical shutter 310 from any of the above-described light emission control circuits 72A, 72B, 72D, and 72E. When receiving the opening signal that puts the optical shutter 310 into the open state as the control signal of the optical shutter 310, the high-voltage power source 393 may generate a predetermined high voltage that is not 0 V, and may apply the voltage between the first electrode 395a and the second electrode 395b. When receiving the closing signal that puts the optical shutter 310 into the closed state as the control signal of the optical shutter 310, the high voltage power source 393 may set the voltage to be applied between the first electrode 395a and the second electrode 395b to 0 V.

The Pockels cell 394 may serve a function equivalent to a $\lambda/2$ plate when the predetermined high voltage is applied between the first electrode 395a and the second electrode 395b. When the predetermined high voltage is not applied between the first electrode 395a and the second electrode 395b, the light in a linear polarization direction perpendicular to a paper surface may pass through the electrooptical crystal 395c in the polarization state and may be then reflected by the polarizer 396. In FIG. 14, the light that is linearly polarized in a direction perpendicular to the paper surface may be illustrated by a black circle on the laser optical path. Here, when the predetermined high voltage is applied, the phase is shifted by $\lambda/2$, and the linear polarized light in the direction perpendicular to the paper surface may be converted into linear polarized light in a direction including the paper surface. In FIG. 14, the light linearly polarized in the direction including the paper surface may be illustrated by an arrow that is illustrated on the laser optical path and perpendicular to the laser optical path. The light may pass through the polarizer 396. The optical shutter 310 may allow the light to pass therethrough during the period in which the high voltage is applied to the electroopcital crystal 395c as described above.

The Pockels cell 394 may possess responsiveness of about 1 ns. Therefore, the Pockels cell 394 may be used as a high-speed optical shutter. Also, for example, an acousto-optic (AO) device may be used as the optical shutter 310. In this case, the AO device may possess responsiveness of about several 100 ns, thereby being used as the optical shutter 310.

9.2 Configuration Example of Optical Isolator

Figure 15:
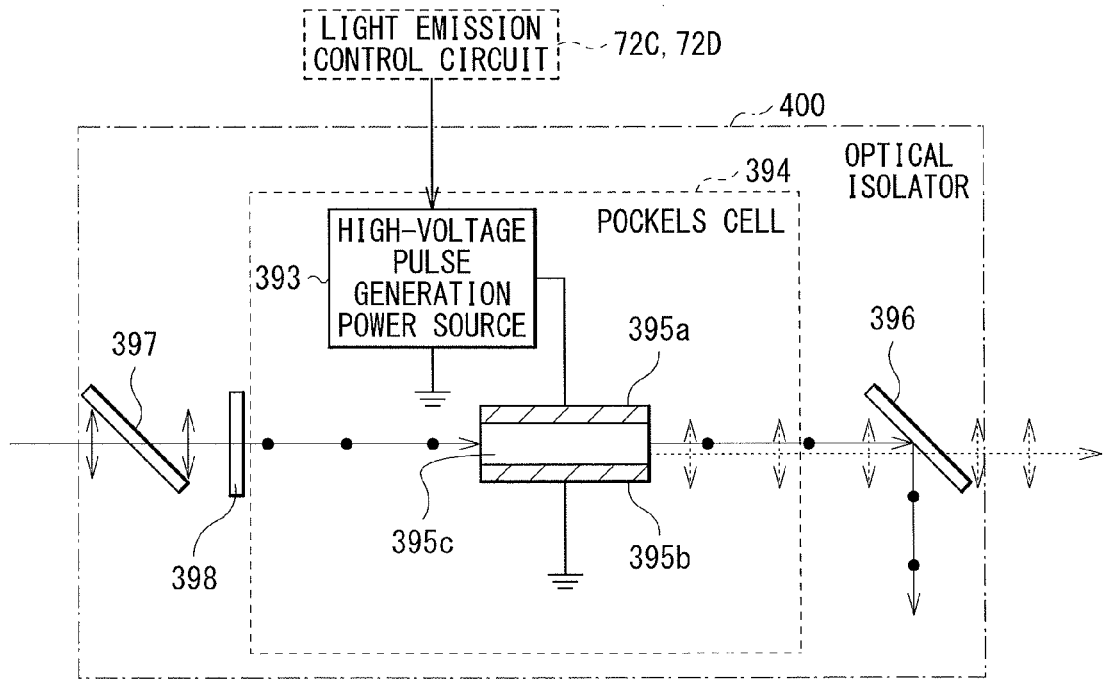
FIG. 15 schematically illustrates a configuration example of an optical isolator.

FIG. 15 schematically illustrates a configuration example of the optical isolator 400. The other optical isolators 401, 402, 40k, and 40n each may include the similar configuration. The optical isolator 400 may have a configuration in which a polarizer 397 and a λ/2 plate 398 are further added to the optical path on the upstream side in the configuration of the optical shutter 310 in FIG. 14. Note that the left side may be the upstream side and the right side may be the downstream side in FIG. 15. The high voltage power source 393 may receive the control signal of the optical isolator 400 from any of the above-described light emission control circuits 72C and 72D. The polarizer 396 and the polarizer 397 may allow the linear polarized light in the direction including the paper surface to pass therethrough. The λ/2 plate 398 may be disposed on the downstream side of the polarizer 397. The λ/2 plate 398 may convert the linear polarized light in the direction including the paper surface into the linear polarized light in the direction perpendicular to the paper surface.

When the predetermined high voltage is applied between the first electrode 395a and the second electrode 395b, the optical isolator 400 may allow the light from both the upstream side and the downstream side to pass therethrough at high transmittance. In other words, the optical isolator 400 may be put into the open state. When the predetermined high voltage is not applied between the first electrode 395a and the second electrode 395b, the optical isolator 400 may suppress transmission of the light from both the upstream side and the downstream side. In other words, the optical isolator 400 may be put into the closed state.

9.3 Hardware Environment of Control Section

A person skilled in the art will appreciate that a general-purpose computer or a programmable controller may be combined with a program module or a software application to execute any subject matter disclosed herein. The program module, in general, may include one or more of a routine, a program, a component, a data structure, and so forth that each causes any process described in any embodiment of the disclosure to be executed.

Figure 16:
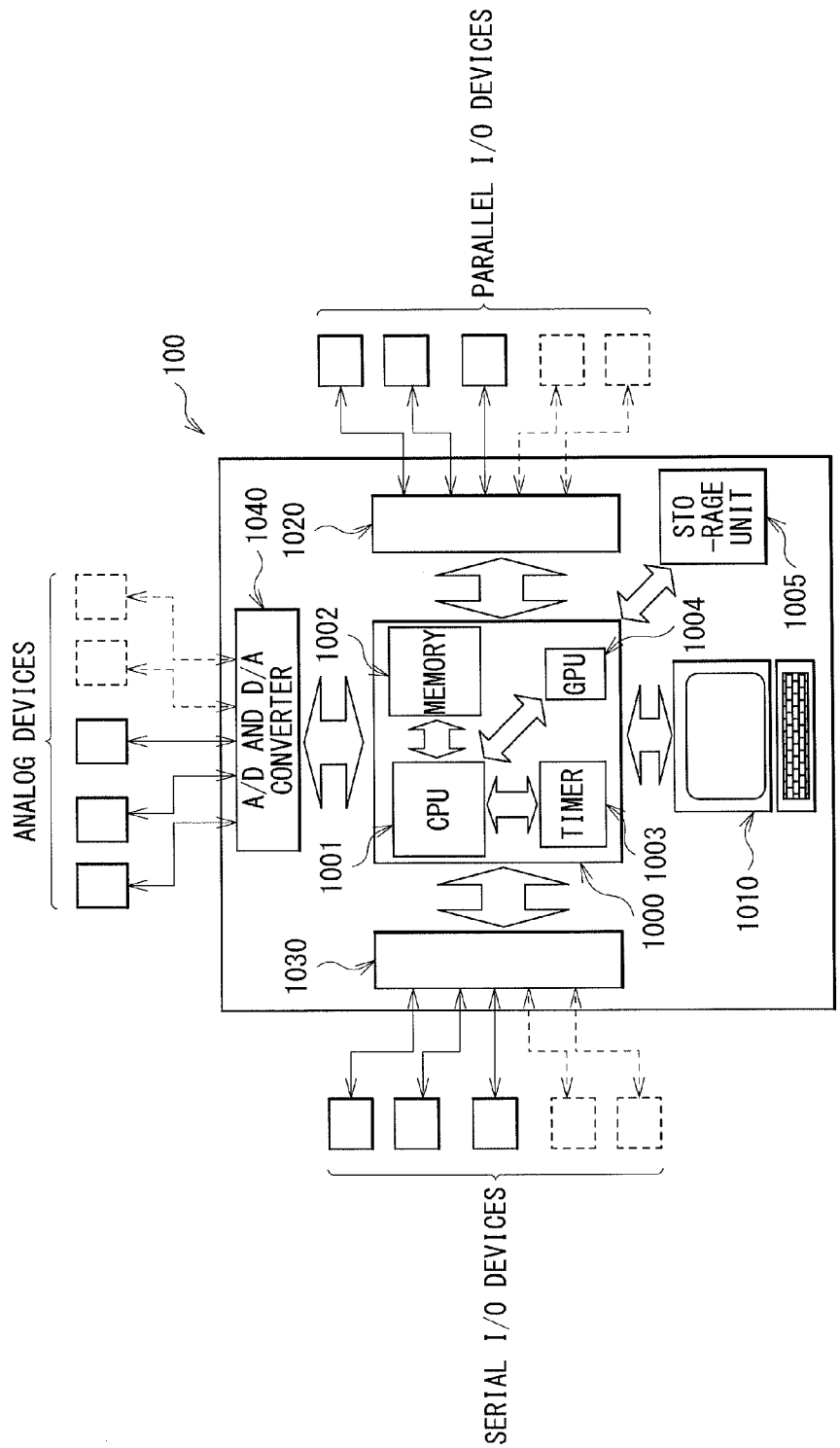
FIG. 16 illustrates an example of hardware environment of a control section.

FIG. 16 is a block diagram illustrating exemplary hardware environment in which various aspects of any subject matter disclosed therein may be executed. An exemplary hardware environment 100 in FIG. 16 may include a processing unit 1000, a storage unit 1005, a user interface 1010, a parallel input/output (I/O) controller 1020, a serial I/O controller 1030, and an analog-to-digital (A/D) and digital-to-analog (D/A) converter 1040. Note that the configuration of the hardware environment is not limited thereto.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially-available processor. A dual microprocessor or any other multi-processor architecture may be used as the CPU 1001.

The components illustrated in FIG. 16 may be connected to one another to execute any process described in any embodiment of the disclosure.

Upon operation, the processing unit 1000 may load programs stored in the storage unit 1005 to execute the loaded programs. The processing unit 1000 may read data from the storage unit 1005 together with the programs, and may write data in the storage unit 1005. The CPU 1001 may execute the programs loaded from the storage unit 1005. The memory 1002 may be a work area in which programs to be executed by the CPU 1001 and data to be used for operation of the CPU 1001 are held temporarily. The timer 1003 may measure time intervals to output a result of the measurement to the CPU 1001 according to the execution of the programs. The GPU 1004 may process image data according to the programs loaded from the storage unit 1005, and may output the processed image data to the CPU 1001.

The parallel I/O controller 1020 may be coupled to parallel I/O devices operable to perform communication with the processing unit 1000, and may control the communication performed between the processing unit 1000 and the parallel I/O devices. Examples of the parallel I/O devices may include the laser apparatus 3, the delay circuit 53, the delay circuit 86, and the delay circuit 121. The serial I/O controller 1030 may be coupled to serial I/O devices operable to perform communication with the processing unit 1000, and may control the communication performed between the processing unit 1000 and the serial I/O devices. Examples of the serial I/O devices may include the one-shot circuit 54, the one-shot circuit 87, the one-shot circuits 90, 91, . . . , 9n, and the pressure adjuster 65. The A/D and D/A converter 1040 may be coupled to analog devices such as a temperature sensor, a pressure sensor, a vacuum gauge sensor, and the target sensor 4, through respective analog ports. The A/D and D/A converter 1040 may control communication performed between the processing unit 1000 and the analog devices, and may perform analog-to-digital conversion and digital-to-analog conversion of contents of the communication.

The user interface 1010 may provide an operator with display showing a progress of the execution of the programs executed by the processing unit 1000, such that the operator is able to instruct the processing unit 1000 to stop execution of the programs or to execute an interruption routine.

The exemplary hardware environment 100 may be applied to one or more of configurations of the EUV light generation controller 5, the laser light traveling direction control section 34, the EUV control system section 50, the EUV control section 51, the target control section 71, and the light emission control circuits 72A to 72E according to any embodiment of the disclosure. A person skilled in the art will appreciate that such controllers may be executed in a distributed computing environment, namely, in an environment where tasks may be performed by processing units linked through any communication network. In any embodiment of the disclosure, the EUV light generation controller 5, the laser light traveling direction control section 34, the light emission control system section 50, the EUV control section 51, the target control section 71, and the light emission control circuits 72A to 72E may be connected to one another through a communication network such as Ethernet (Registered Trademark) or the Internet. In the distributed computing environment, the program module may be stored in each of local and remote memory storage devices.

The foregoing description is intended to be merely illustrative rather than limiting. It should therefore be appreciated that variations may be made in example embodiments of the disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Also, the singular forms "a", "an", and "the" used in the specification and the appended claims include plural references unless expressly and unequivocally limited to one referent.

What is claimed is:

1. An extreme ultraviolet light generating system comprising:
   a laser apparatus configured to provide pulsed laser light inside a chamber in which EUV light is generated;
   an optical shutter disposed on an optical path of the pulsed laser light;
   a controller configured to open or close the optical shutter, based on a generation signal supplied from an external unit, the generation signal instructing generation of the EUV light;
   a light emission trigger generator configured to generate a light emission trigger signal and to supply the light emission trigger signal to the laser apparatus, the light emission trigger signal instructing output of the pulsed laser light;
   a target feeder configured to feed a target inside the chamber, the target being to be irradiated with the pulsed laser light outputted from the laser apparatus;
   a detector configured to detect feed timing at which the target is fed from the target feeder and to provide the light emission trigger generator with a first timing signal indicating the feed timing; and
   a timer circuit configured to generate a second timing signal and to provide the light emission trigger generator with the second timing signal, during absence of the first timing signal from the detector,
   wherein the light emission trigger generator generates the light emission trigger signal, based on the first timing signal and the second timing signal.

2. The extreme ultraviolet light generating system according to claim 1, wherein
   the optical shutter comprises a plurality of optical shutter devices, and
   the controller controls the plurality of optical shutter devices to allow open timings or close timings to be different each other, depending on positions of the respective optical shutter devices on the optical path of the pulsed laser light.

3. The extreme ultraviolet light generating system according to claim 1, wherein
   the laser apparatus comprises a plurality of laser units,
   the optical shutter comprises a plurality of optical shutter devices, and
   the optical shutter devices are disposed on respective optical paths of the pulsed laser light output from the plurality of laser units.

4. The extreme ultraviolet light generating system according to claim 1, wherein the laser apparatus continuously outputs the pulsed laser light irrespective of presence or absence of the supply of the generation signal.

5. The extreme ultraviolet light generating system according to claim 1, wherein the optical shutter comprises an optical isolator.

6. The extreme ultraviolet light generating system according to claim 1, wherein the light emission trigger generator includes a first OR circuit, the first OR circuit being coupled to the timer circuit and configured to receive the first timing signal and the second timing signal.

7. The extreme ultraviolet light generating system according to claim 1, wherein the timer circuit outputs the second timing signal to the light emission trigger generator, when the absence of the first timing signal from the detector exceeds a time interval in which the target is fed.

8. The extreme ultraviolet light generating system according to claim 6, wherein the light emission trigger generator includes:
   a second OR circuit configured to receive the first timing signal and the second timing signal; and
   a delay circuit coupled to the second OR circuit.

9. The extreme ultraviolet light generating system according to claim 8, wherein the delay circuit generates the light emission trigger signal.

10. The extreme ultraviolet light generating system according to claim 8, wherein the light emission trigger generator includes a first one-shot circuit configured to receive the second timing signal.

11. The extreme ultraviolet light generating system according to claim 10, wherein the light emission trigger generator includes:
    an inverter; and
    a third OR circuit configured to receive an output signal of the first one-shot circuit through the inverter.

12. The extreme ultraviolet light generating system according to claim 11, wherein the third OR circuit receives the generation signal.

13. The extreme ultraviolet light generating system according to claim 12, wherein the third OR circuit outputs an optical shutter control signal that opens or closes the optical shutter.

14. The extreme ultraviolet light generating system according to claim 10, wherein a length of a pulse width of an output signal of the first one-shot circuit is longer than a time in which the pulsed laser light passes through the optical shutter after the light emission trigger signal is inputted to the laser apparatus.

15. The extreme ultraviolet light generating system according to claim 11, wherein the light emission trigger generator includes:
    an AND circuit configured to receive the light emission trigger signal outputted from the delay circuit; and
    a second one-shot circuit configured to receive the light emission trigger signal outputted from the delay circuit.

16. The extreme ultraviolet light generating system according to claim 15, wherein the AND circuit receives the output signal of the third OR circuit.

* * * * *